US012745425B2

(12) United States Patent
Zou et al.

(10) Patent No.: US 12,745,425 B2
(45) Date of Patent: Sep. 22, 2026

(54) U-SHAPED SPACER TO PROTECT THE INTRA-DEVICE SPACE REGION FOR STACKED FET

(71) Applicant: INTERNATIONAL BUSINESS MACHINES CORPORATION, Armonk, NY (US)

(72) Inventors: Lijuan Zou, Albany, NY (US); Jay William Strane, Wappingers Falls, NY (US); Junli Wang, Slingerlands, NY (US); Brent A. Anderson, Jericho, VT (US); Ruilong Xie, Niskayuna, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 18/528,975

(22) Filed: Dec. 5, 2023

(65) Prior Publication Data

US 2025/0185298 A1 Jun. 5, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01); *H10D 62/151* (2025.01); *H10D 64/017* (2025.01); *H10D 64/018* (2025.01); *H10D 84/0128* (2025.01); *H10D 84/0151* (2025.01); *H10D 84/038* (2025.01); *H10D 84/83* (2025.01)

(58) Field of Classification Search
None
See application file for complete search history.

(56) References Cited

U.S. PATENT DOCUMENTS 8,815,742 B2 8/2014 Cai
9,659,963 B2 5/2017 Cheng
(Continued)

OTHER PUBLICATIONS

International Searching Authority, "Notification of Transmittal of the International Search Report and the Written Opinion of the International Searching Authority, or Declaration," Patent Cooperation Treaty Apr. 14, 2025, 06 pages, International Application No.—PCT/IB2024/062061.

*Primary Examiner* — Cory W Eskridge
(74) *Attorney, Agent, or Firm* — Samuel A. Waldbaum

(57) ABSTRACT

A microelectronic structure that includes a stack nanosheet transistor comprising a lower nanosheet transistor and an upper nanosheet transistor. The lower nanosheet transistor includes a lower source/drain and the upper nanosheet transistor includes an upper source/drain. An airgap located between the upper source/drain and the lower source/drain. The airgap is vertically aligned with the upper source/drain and the lower source/drain. A first layer located between the airgap and the lower source/drain.

20 Claims, 44 Drawing Sheets

CROSS-SECTION X1

(56) References Cited

U.S. PATENT DOCUMENTS

| | | | | |
|---|---|---|---|---|
| 9,837,414 | B1 | 12/2017 | Balakrishnan | |
| 10,192,867 | B1 | 1/2019 | Frougier | |
| 11,069,684 | B1 * | 7/2021 | Xie | H10D 30/014 |
| 11,355,494 | B1 | 6/2022 | Yang et al. | |
| 2021/0296184 | A1 * | 9/2021 | Xie | H10D 30/014 |
| 2022/0102509 | A1 | 3/2022 | Lin et al. | |
| 2022/0262914 | A1 | 8/2022 | Wu | |
| 2023/0065091 | A1 | 3/2023 | Reznicek | |
| 2023/0068065 | A1 * | 3/2023 | Khaderbad | H10D 30/014 |
| 2023/0163127 | A1 | 5/2023 | Wu | |
| 2023/0215949 | A1 | 7/2023 | Zhang | |
| 2024/0339452 | A1 * | 10/2024 | Anderson | H10D 30/014 |

* cited by examiner

TOP DOWN VIEW

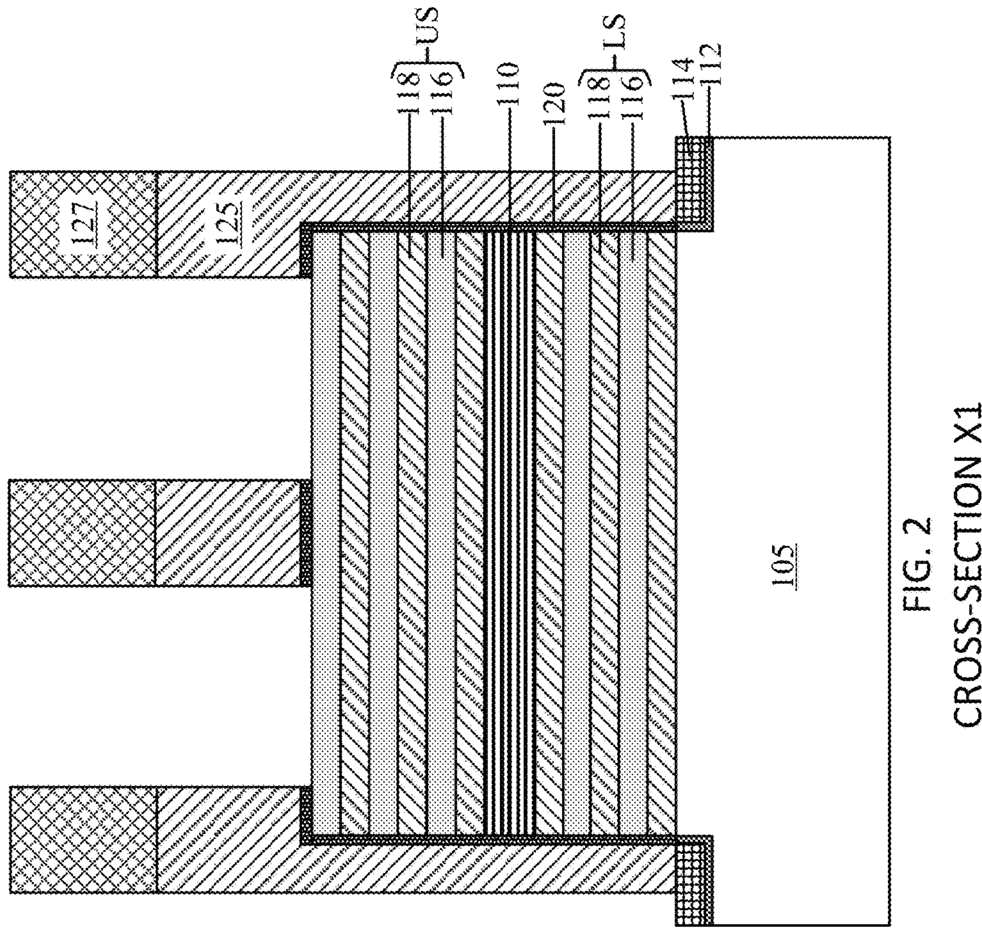
FIG. 2
CROSS-SECTION X1
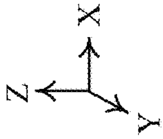

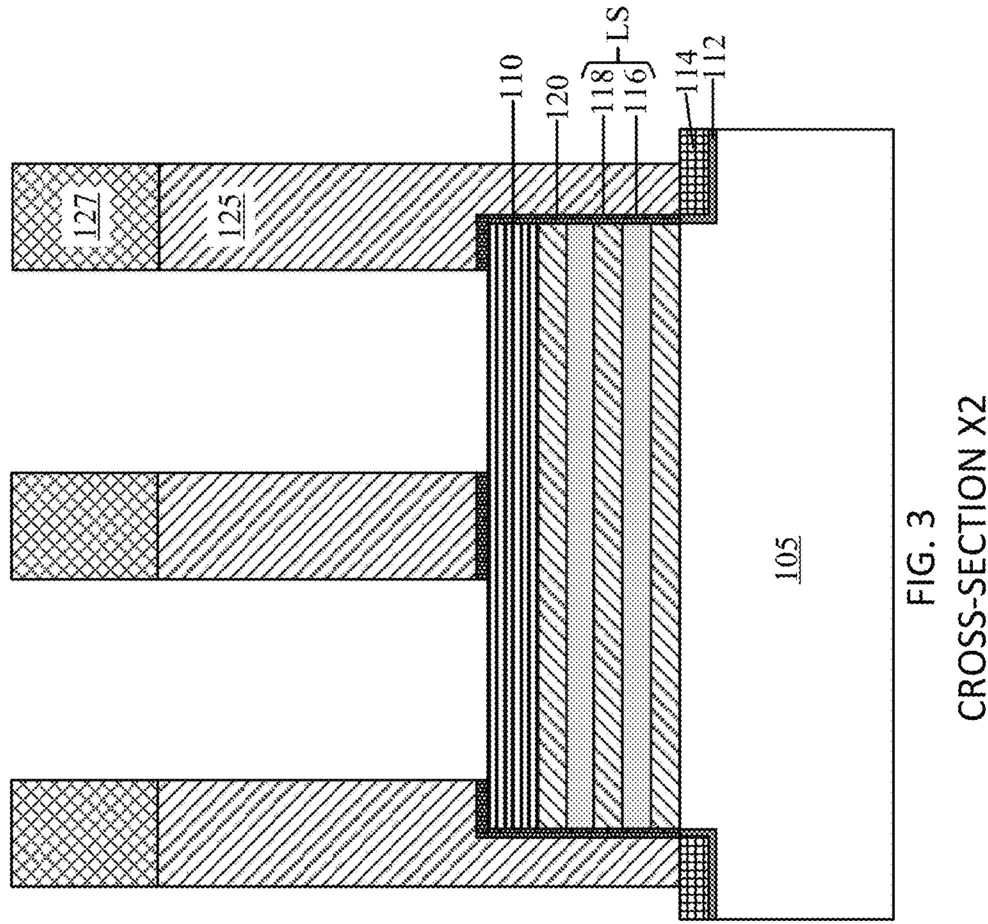
FIG. 3
CROSS-SECTION X2
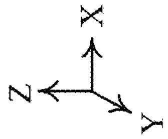

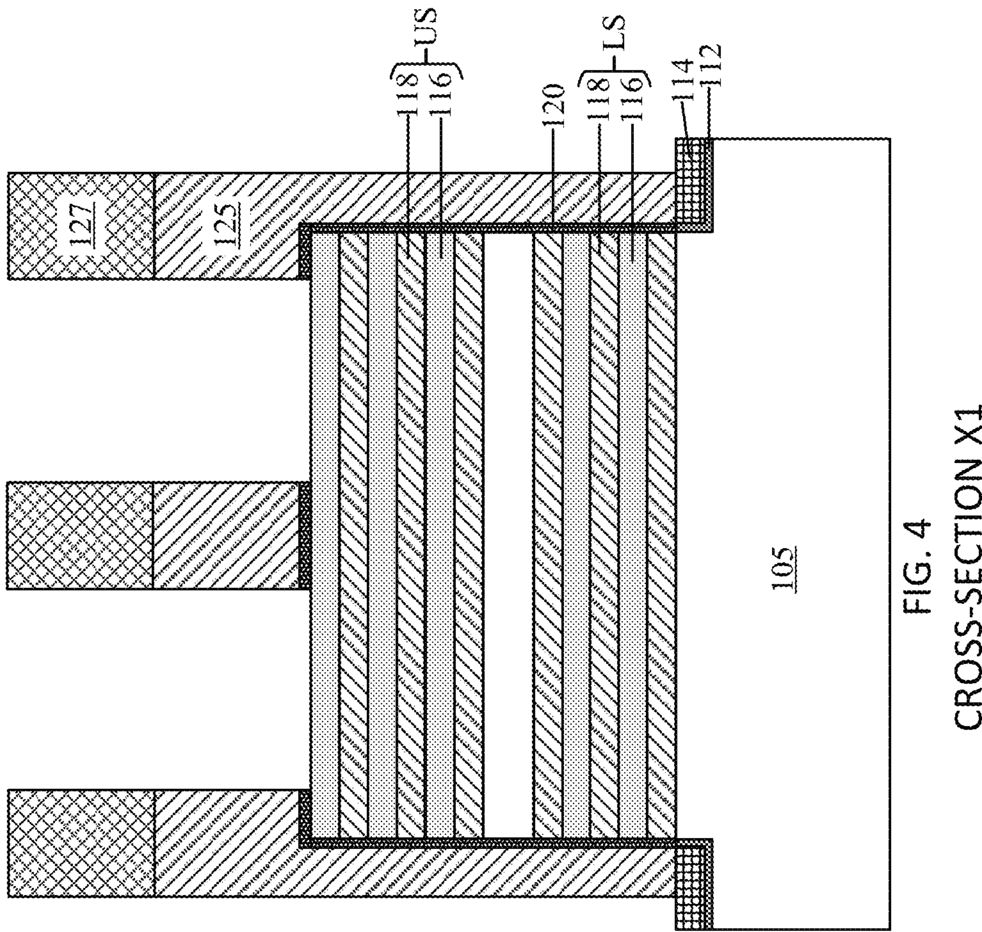
FIG. 4
CROSS-SECTION X1
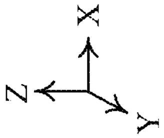

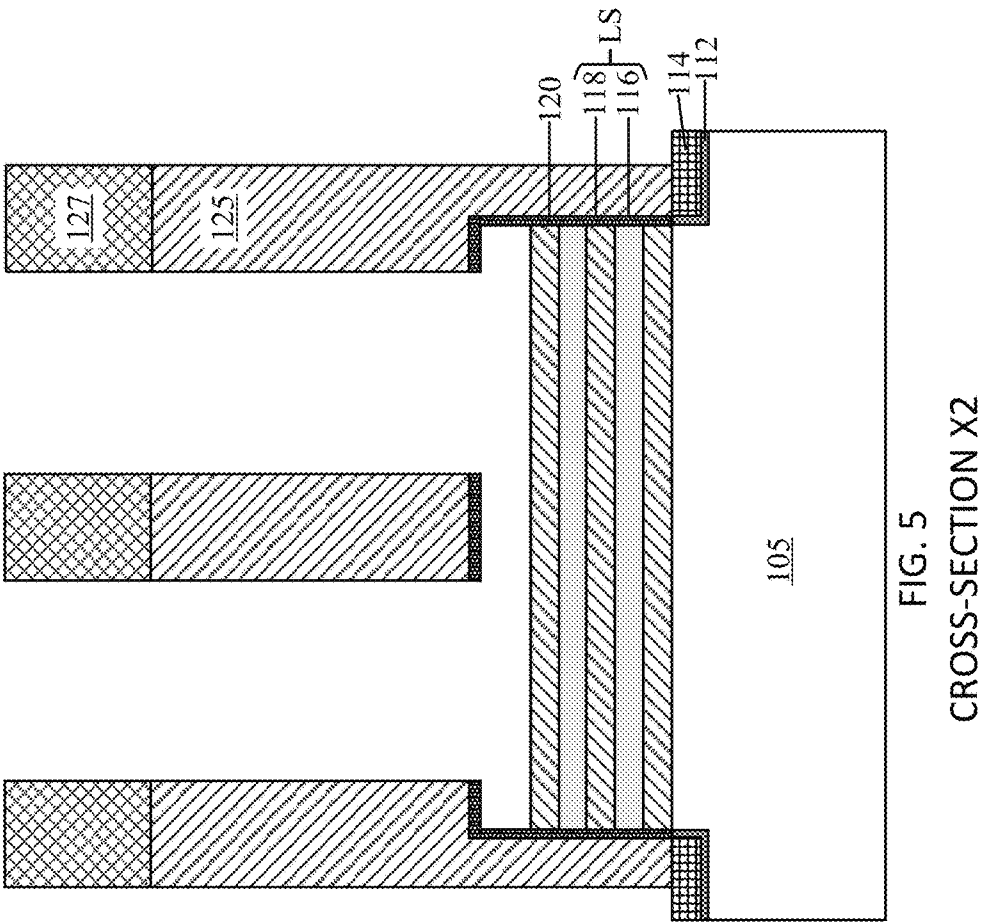
FIG. 5
CROSS-SECTION X2
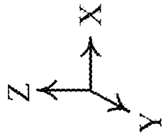

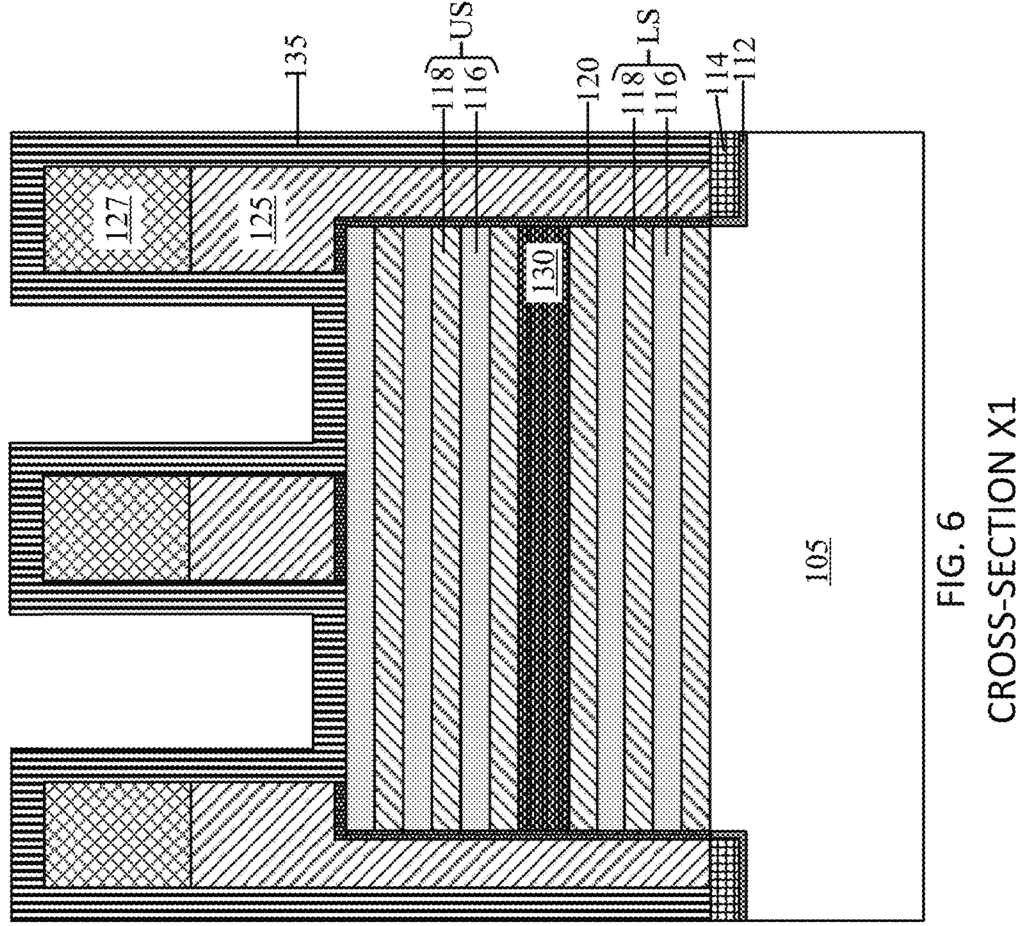
FIG. 6
CROSS-SECTION X1
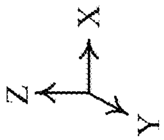

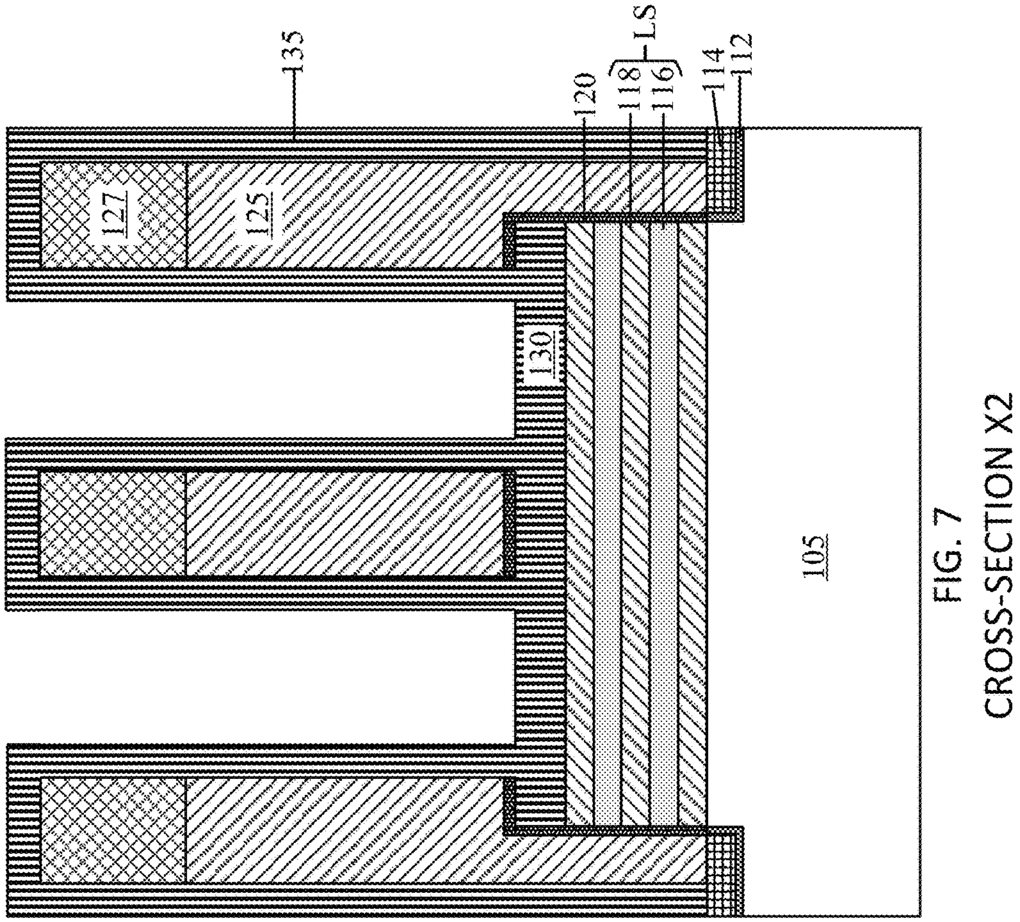
FIG. 7
CROSS-SECTION X2
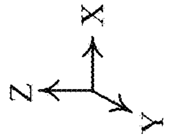

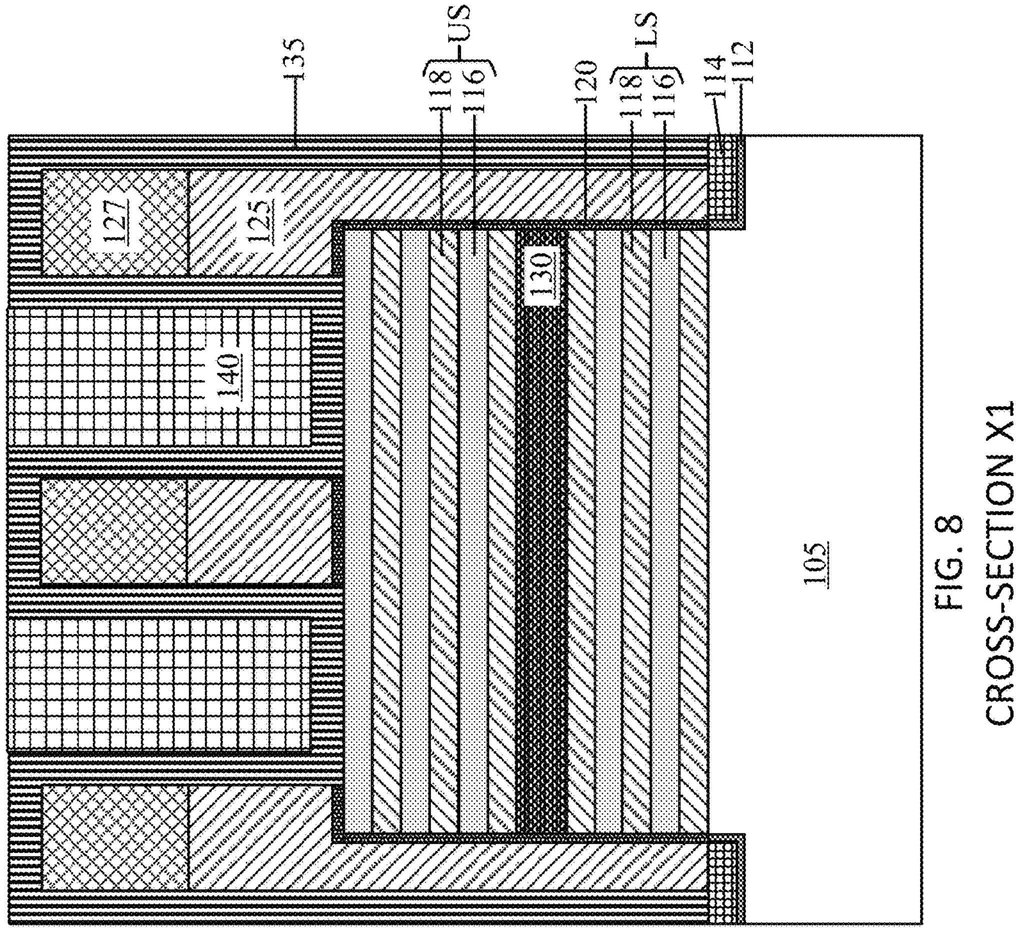
FIG. 8
CROSS-SECTION X1
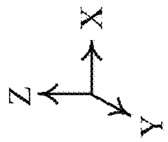

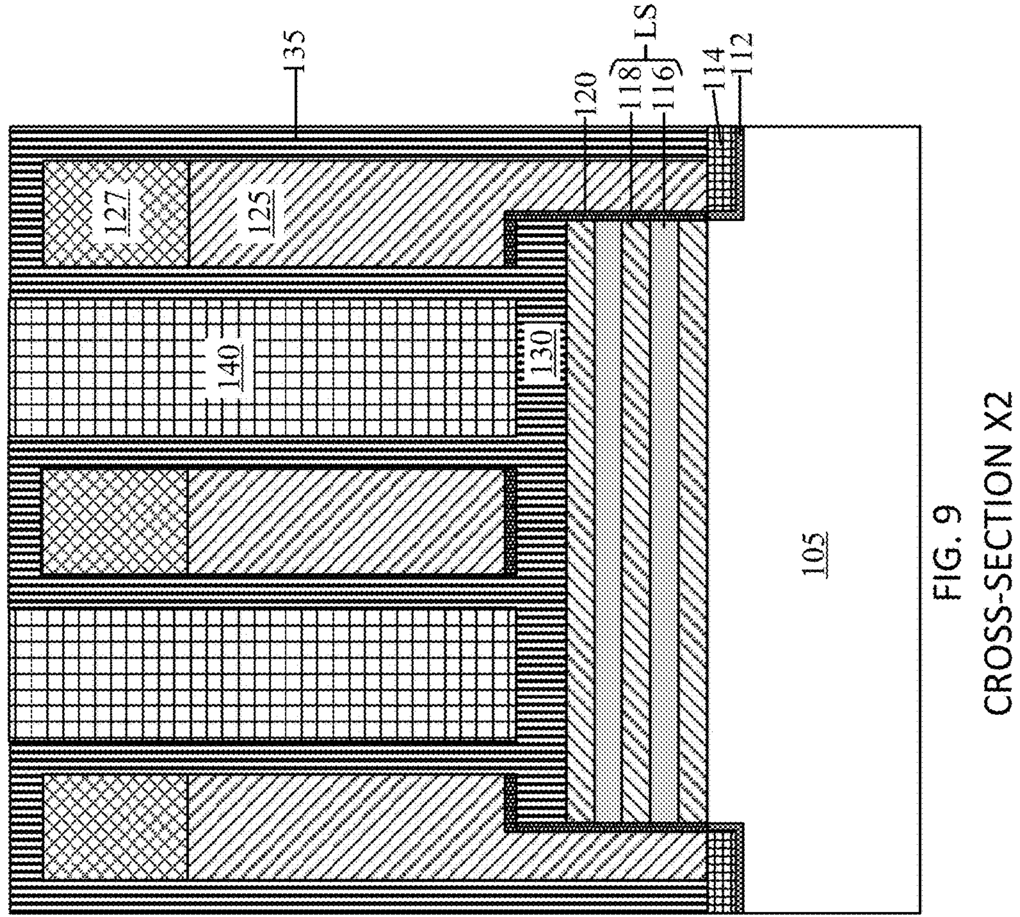
FIG. 9
CROSS-SECTION X2
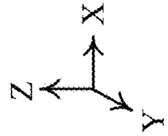

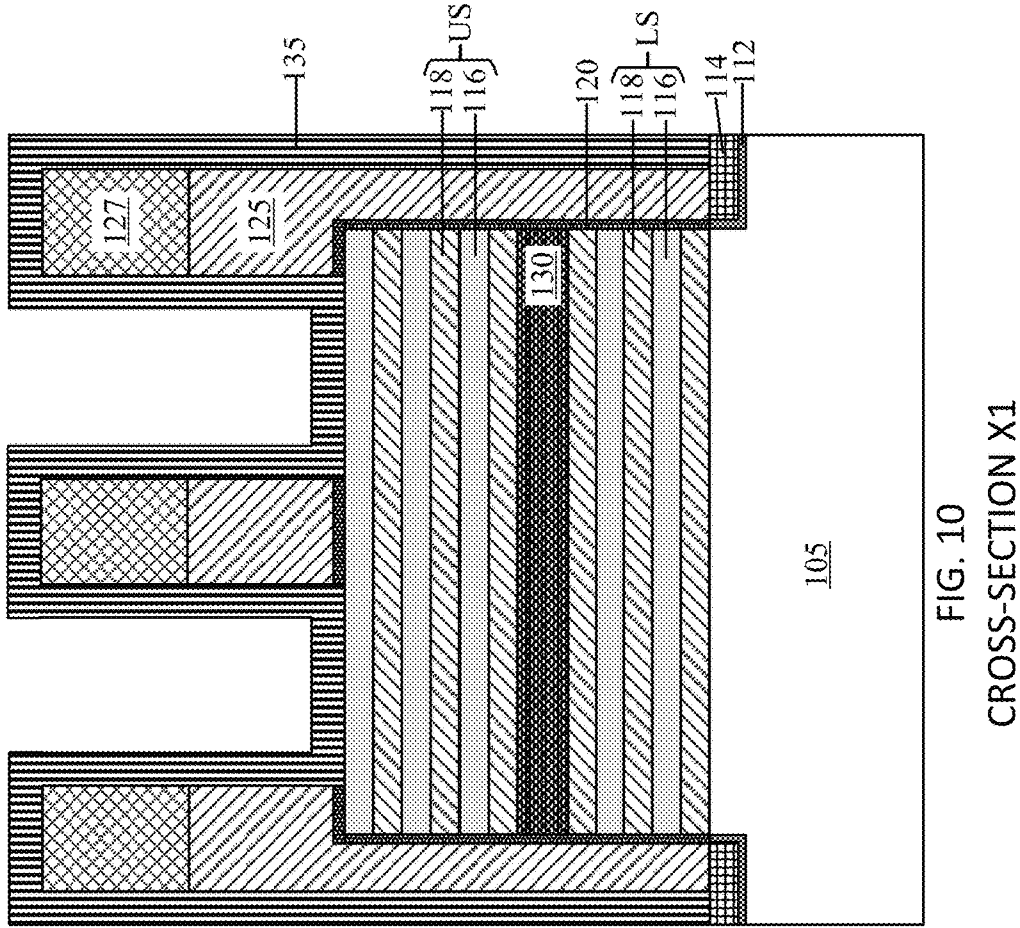
FIG. 10
CROSS-SECTION X1
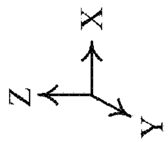

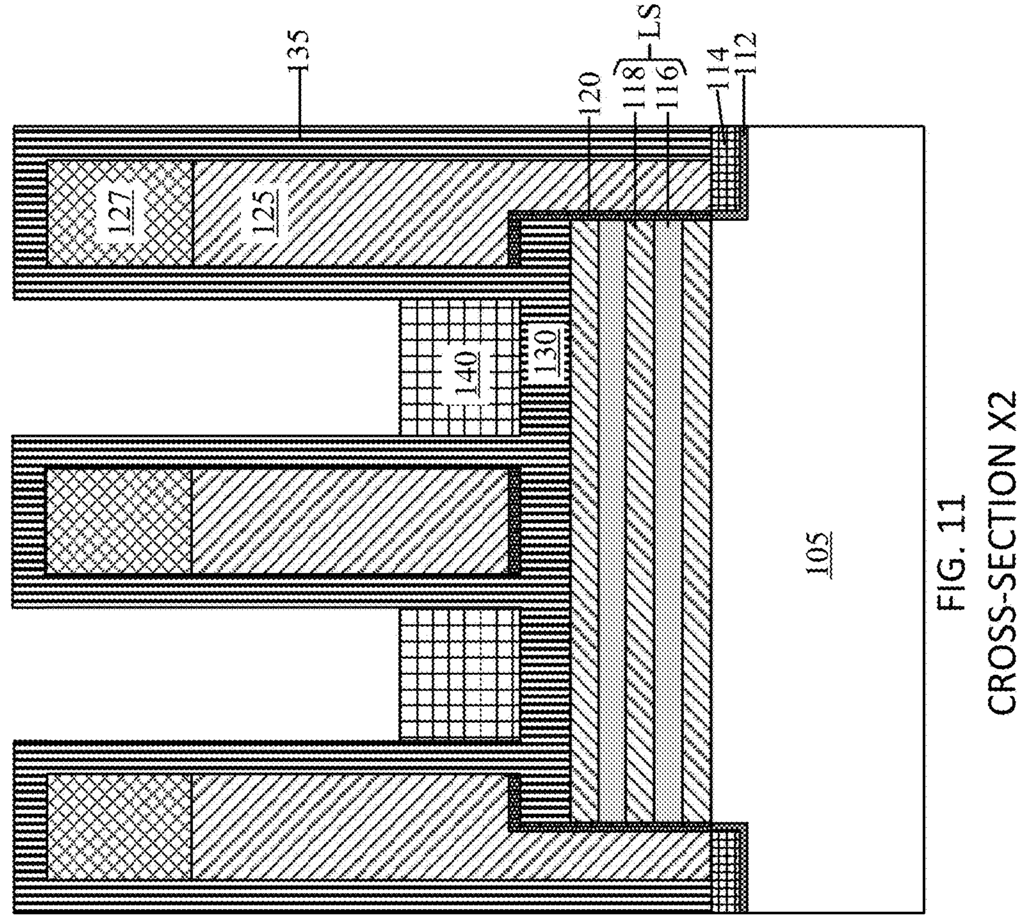
FIG. 11
CROSS-SECTION X2
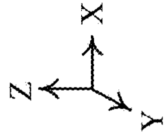

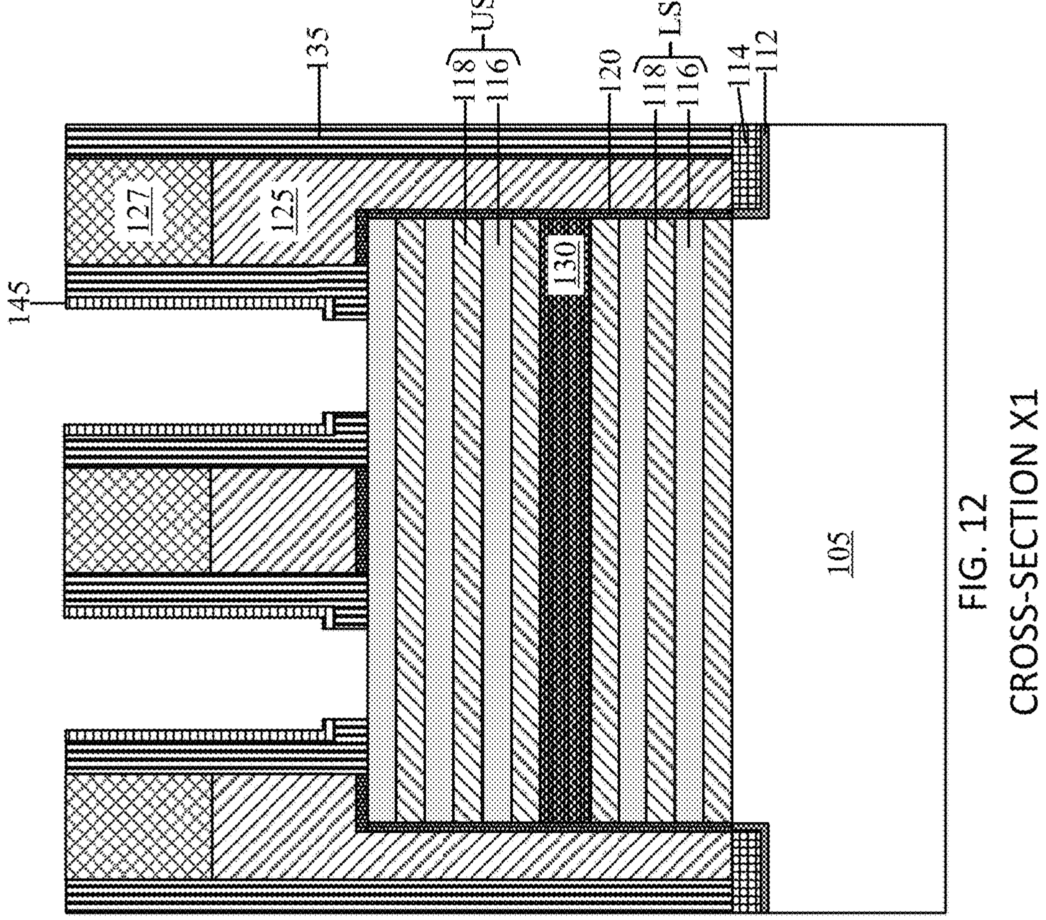
135
118
116
US
120
118
116
LS
114
112
145
127
125
130
105
FIG. 12
CROSS-SECTION X1
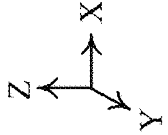
X
Z
Y

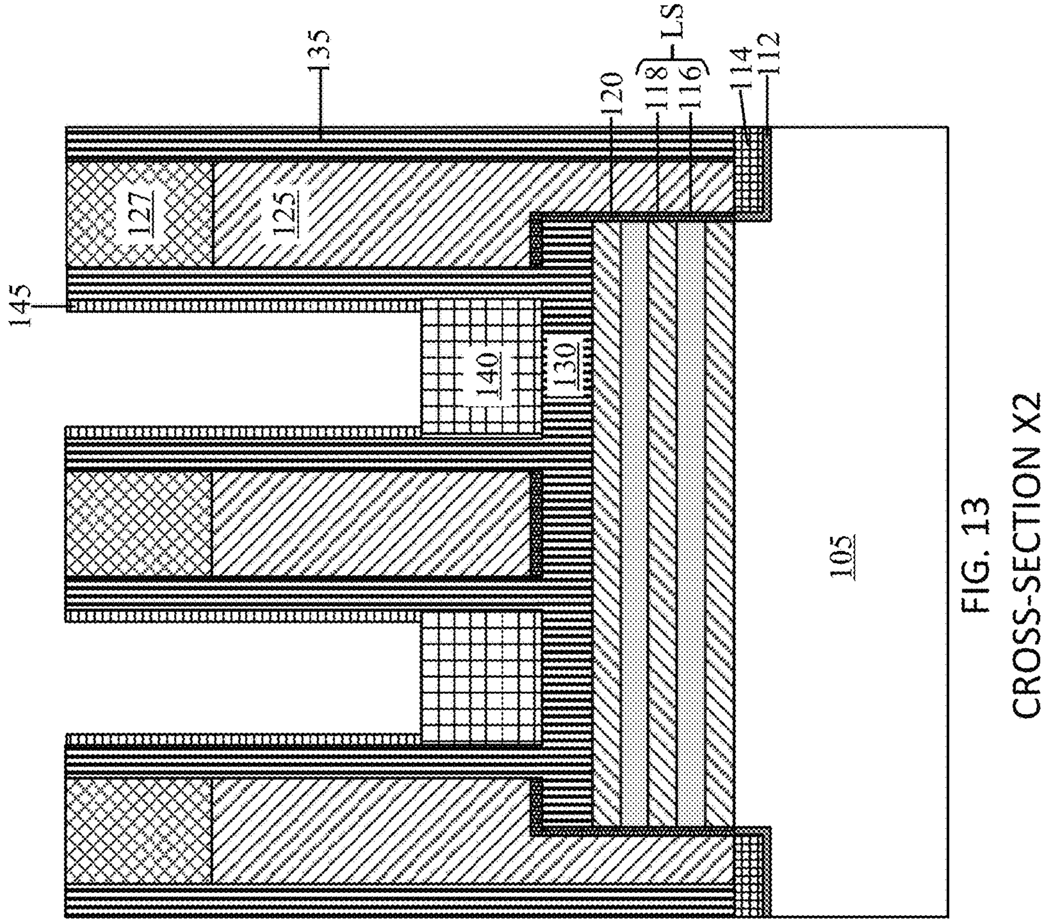
FIG. 13
CROSS-SECTION X2
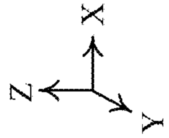

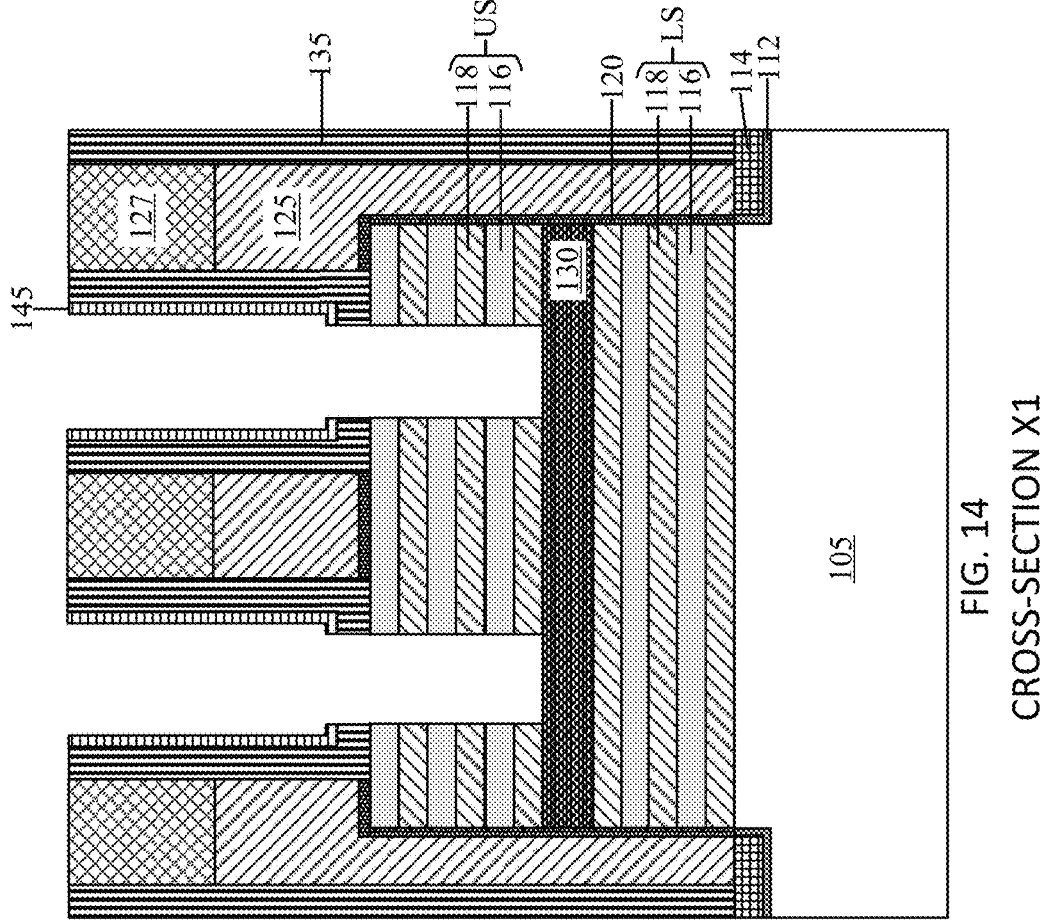
135
118
116
US
120
118
116
LS
114
112
145
127
125
130
105
FIG. 14
CROSS-SECTION X1
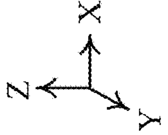
X
Z
Y

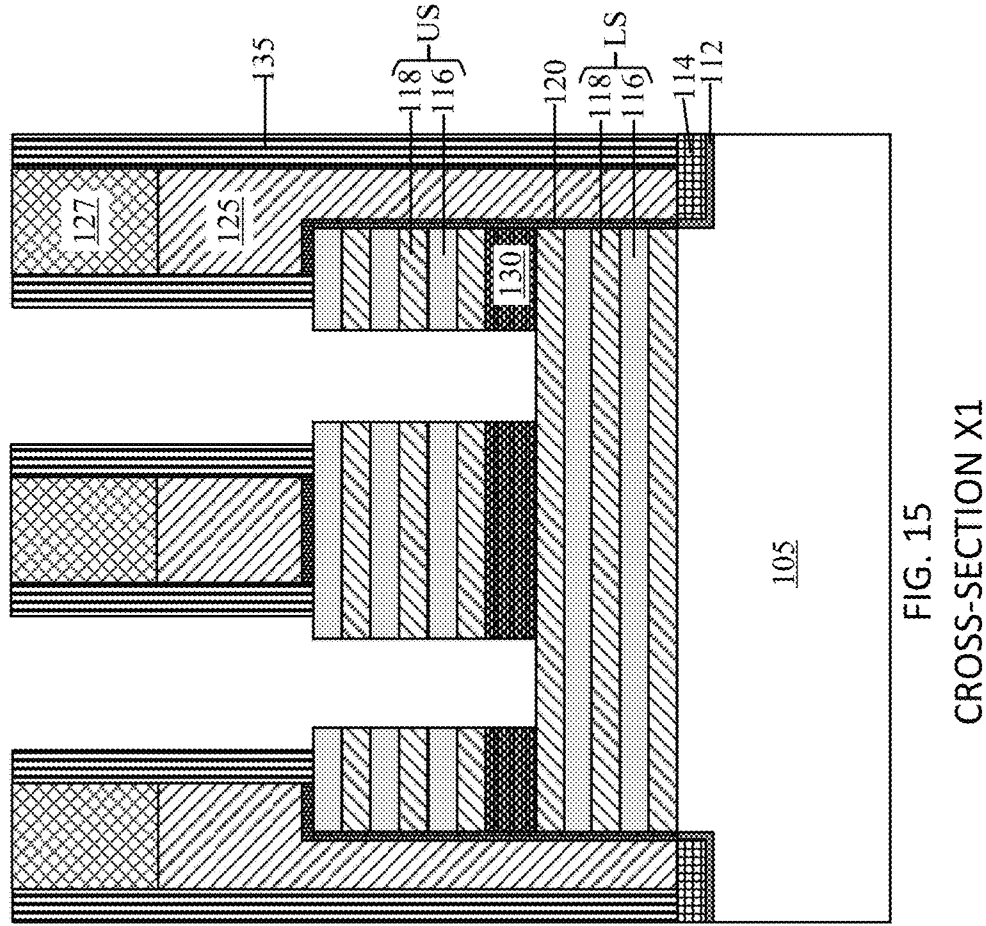
FIG. 15
CROSS-SECTION X1
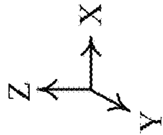

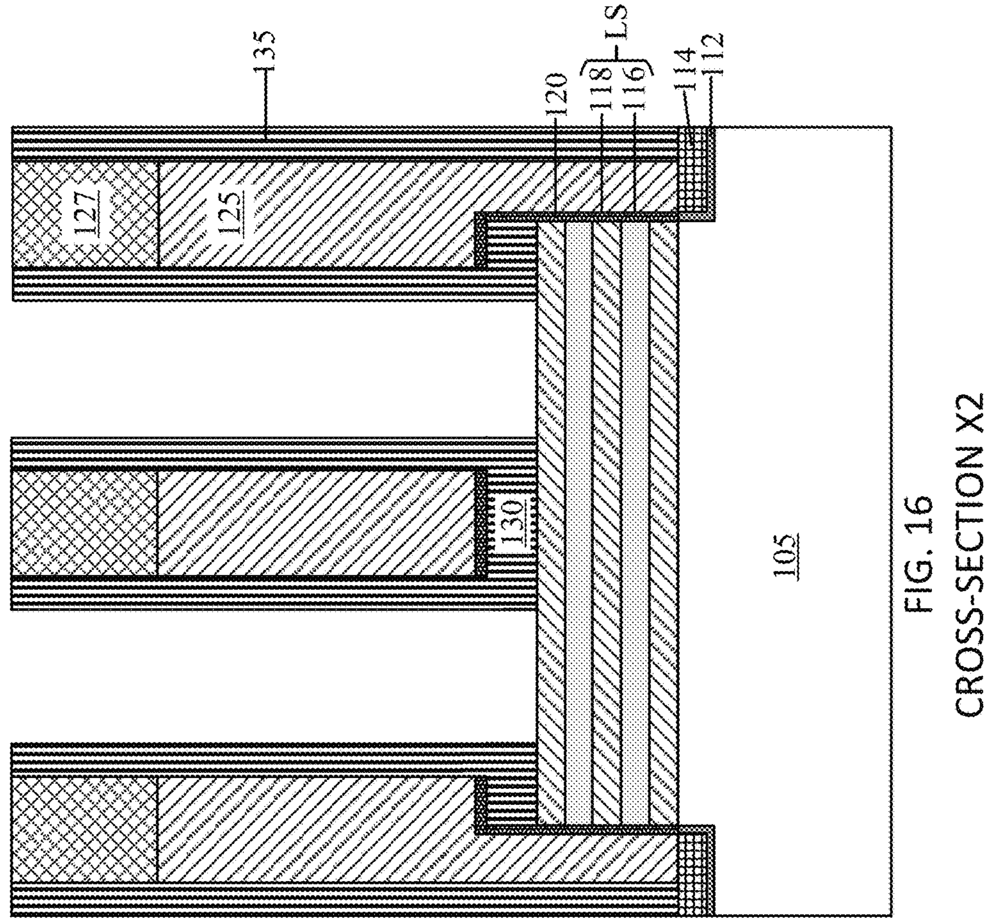
FIG. 16
CROSS-SECTION X2
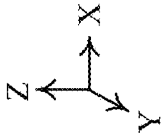

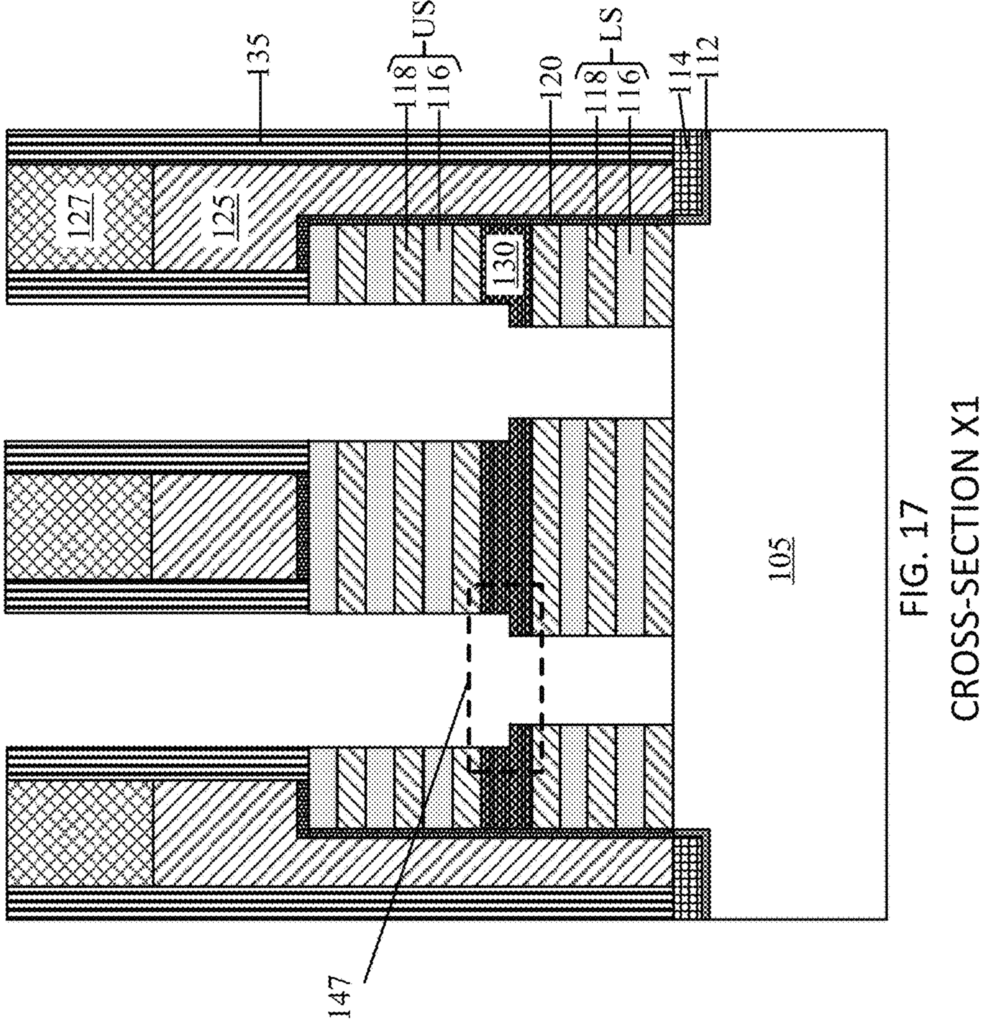
FIG. 17
CROSS-SECTION X1
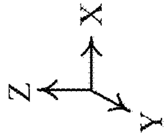

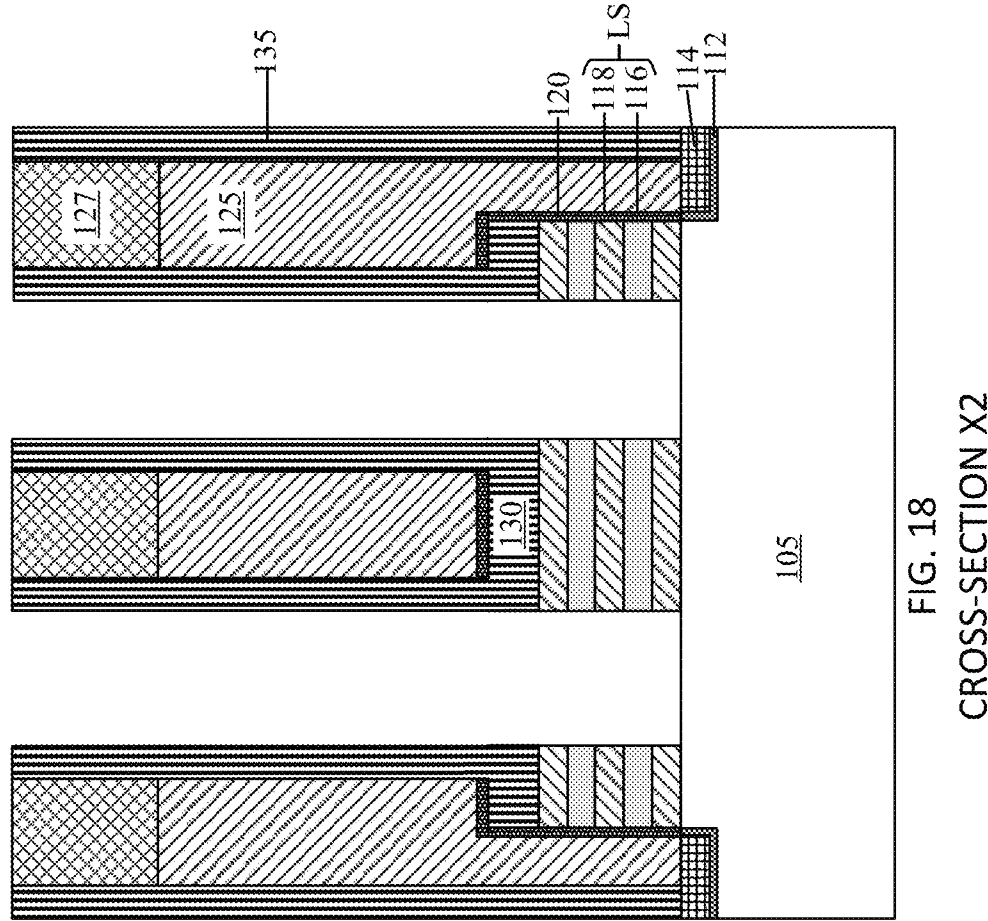
135
LS
120
118
116
114
112
127
125
130
105
FIG. 18
CROSS-SECTION X2
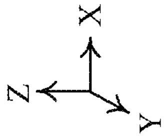
X
Z
Y

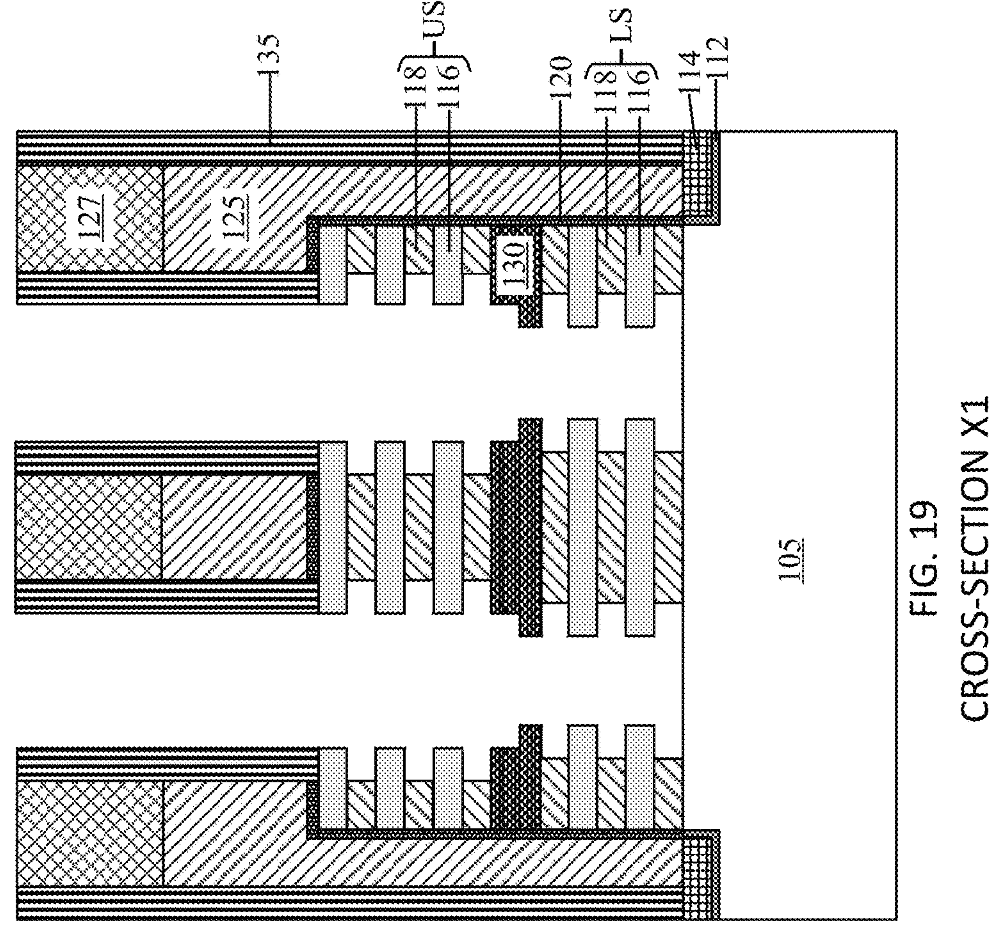
FIG. 19
CROSS-SECTION X1
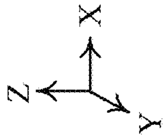

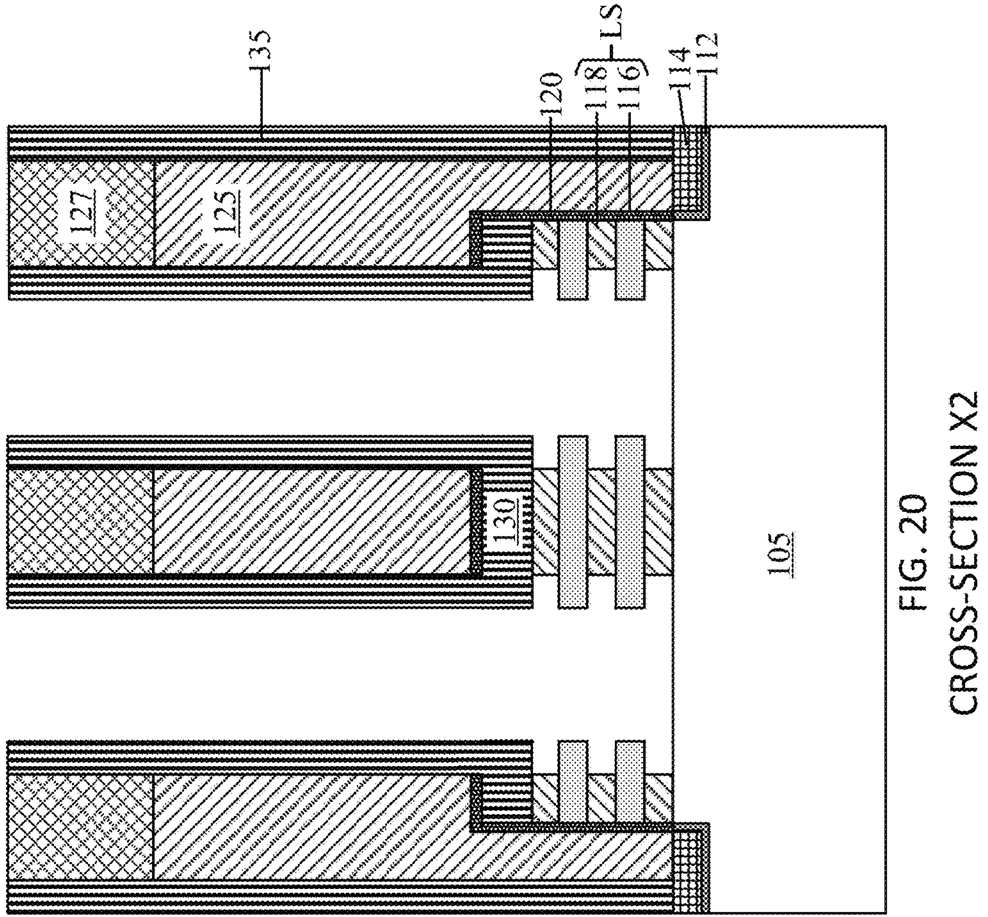
135
LS
120
118
116
114
112
127
125
130
105
FIG. 20
CROSS-SECTION X2
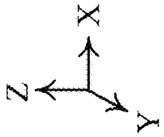
X
Z
Y

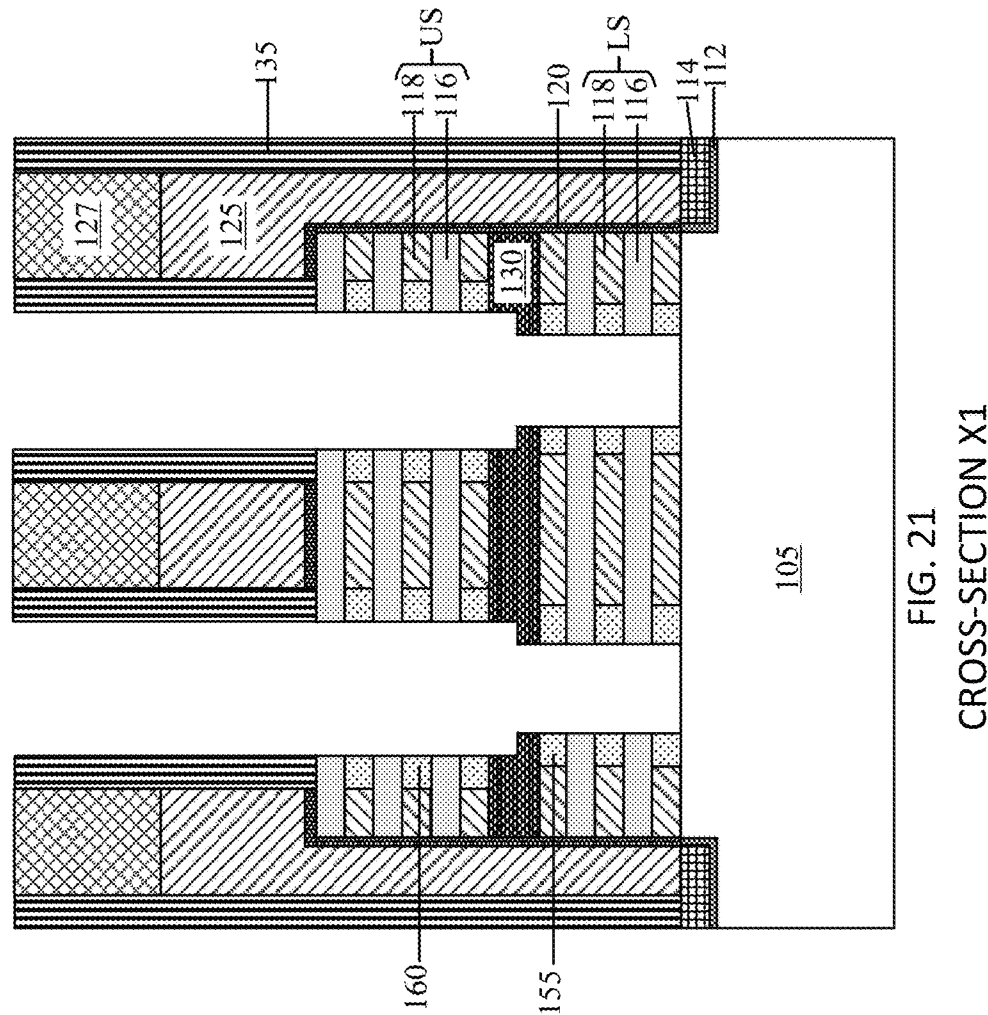
FIG. 21
CROSS-SECTION X1
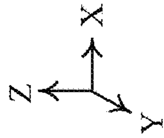

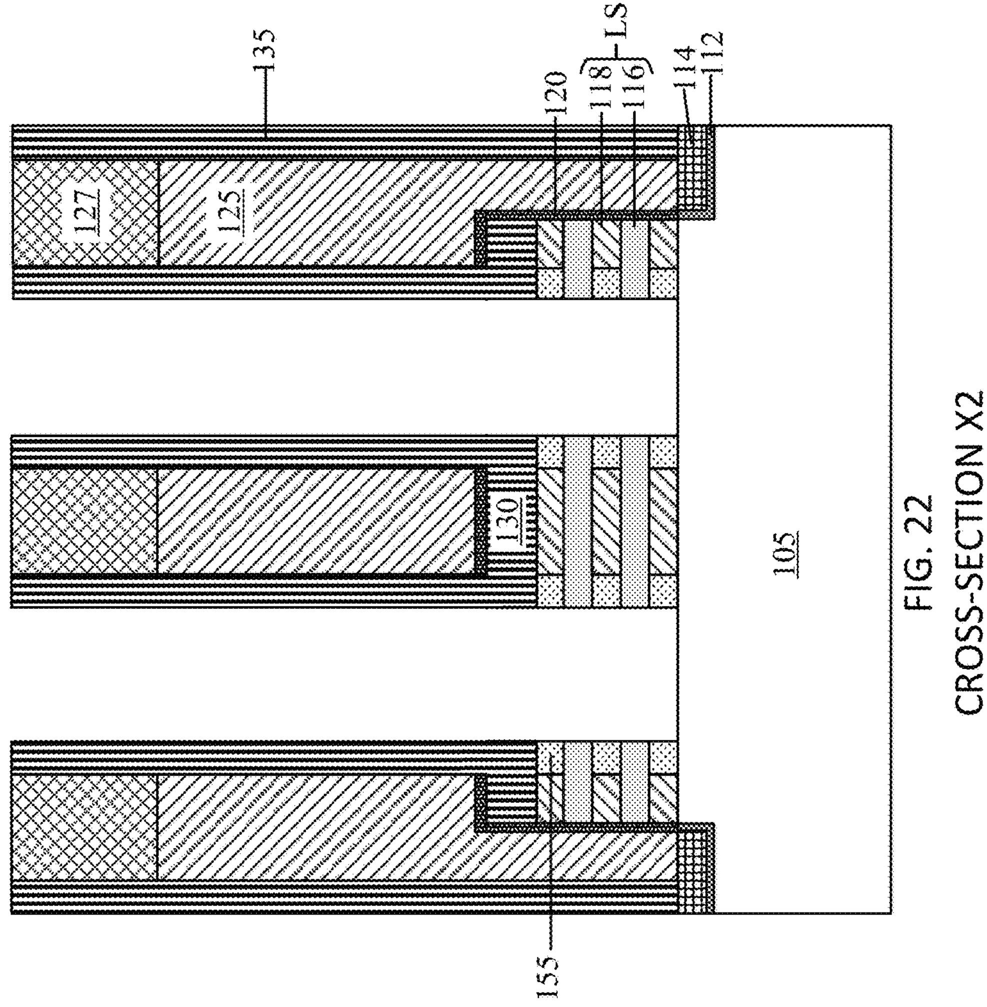
FIG. 22
CROSS-SECTION X2
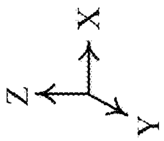

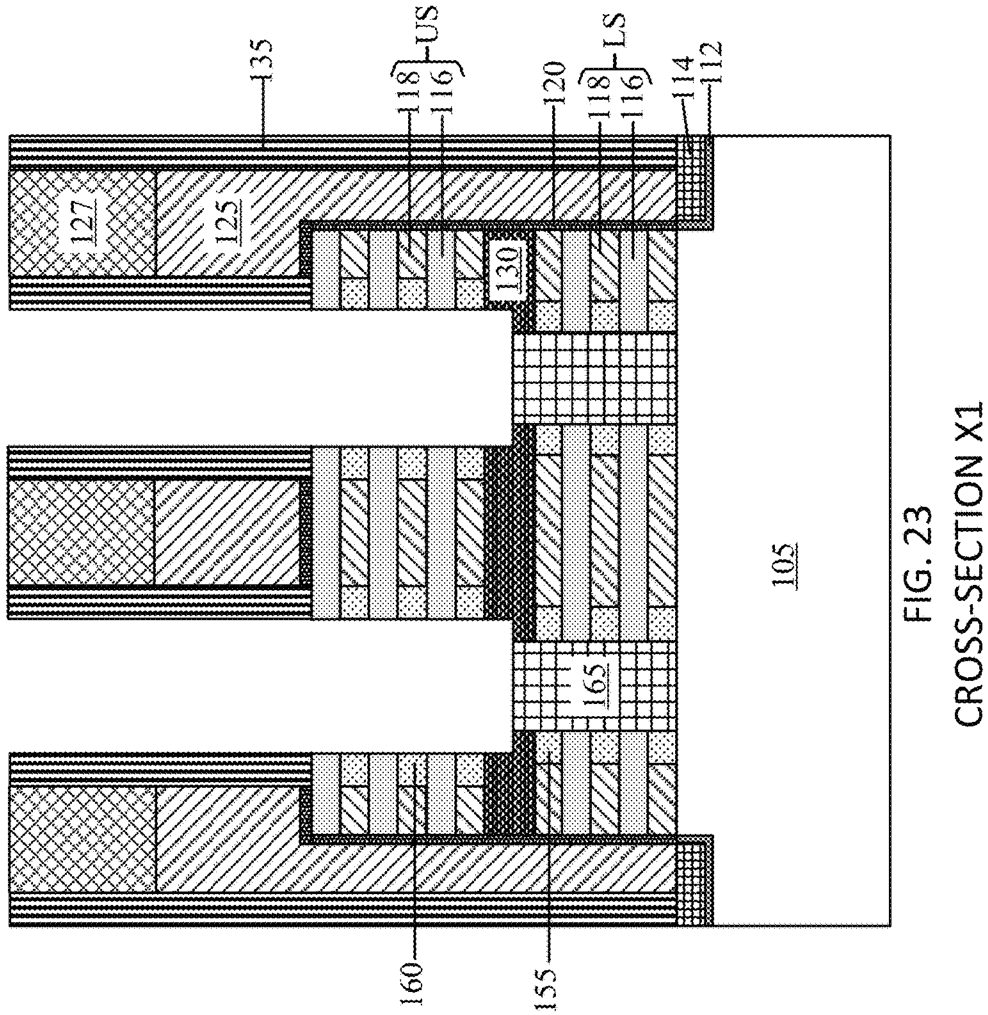
FIG. 23
CROSS-SECTION X1
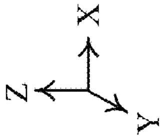

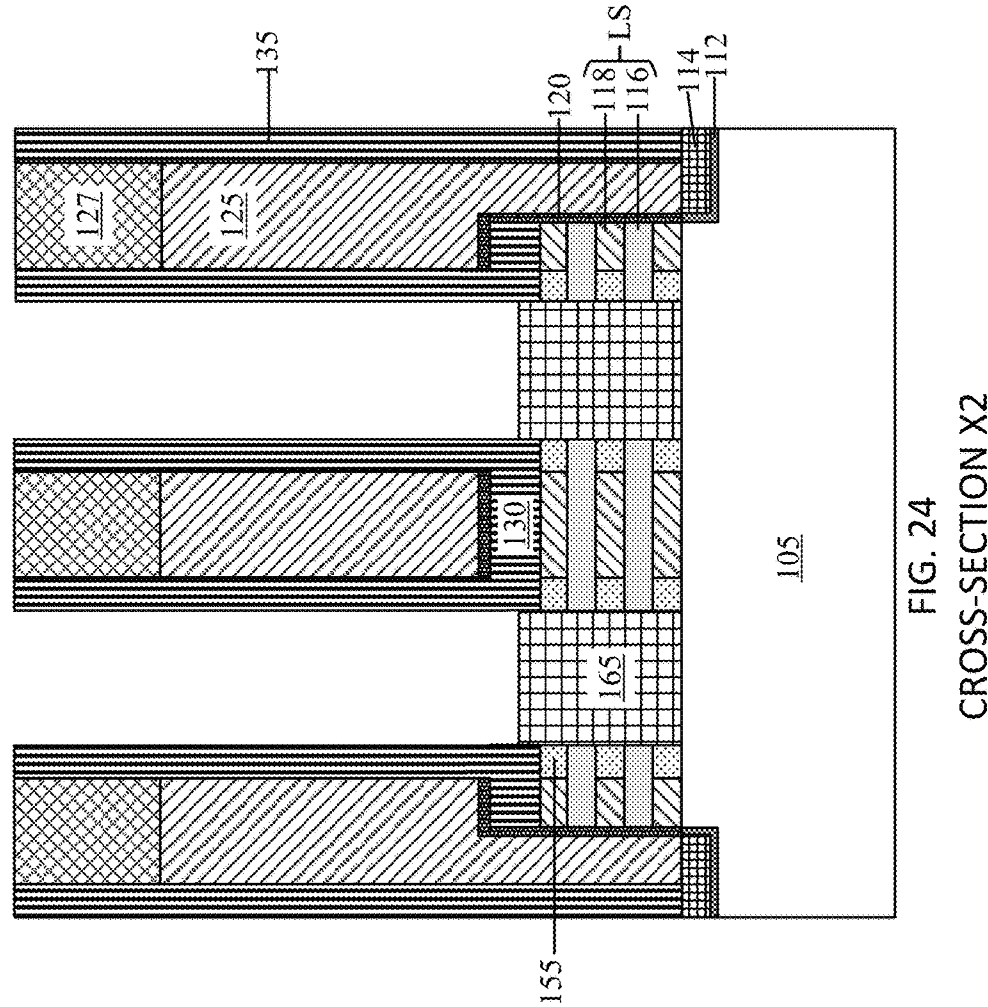
FIG. 24
CROSS-SECTION X2
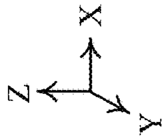

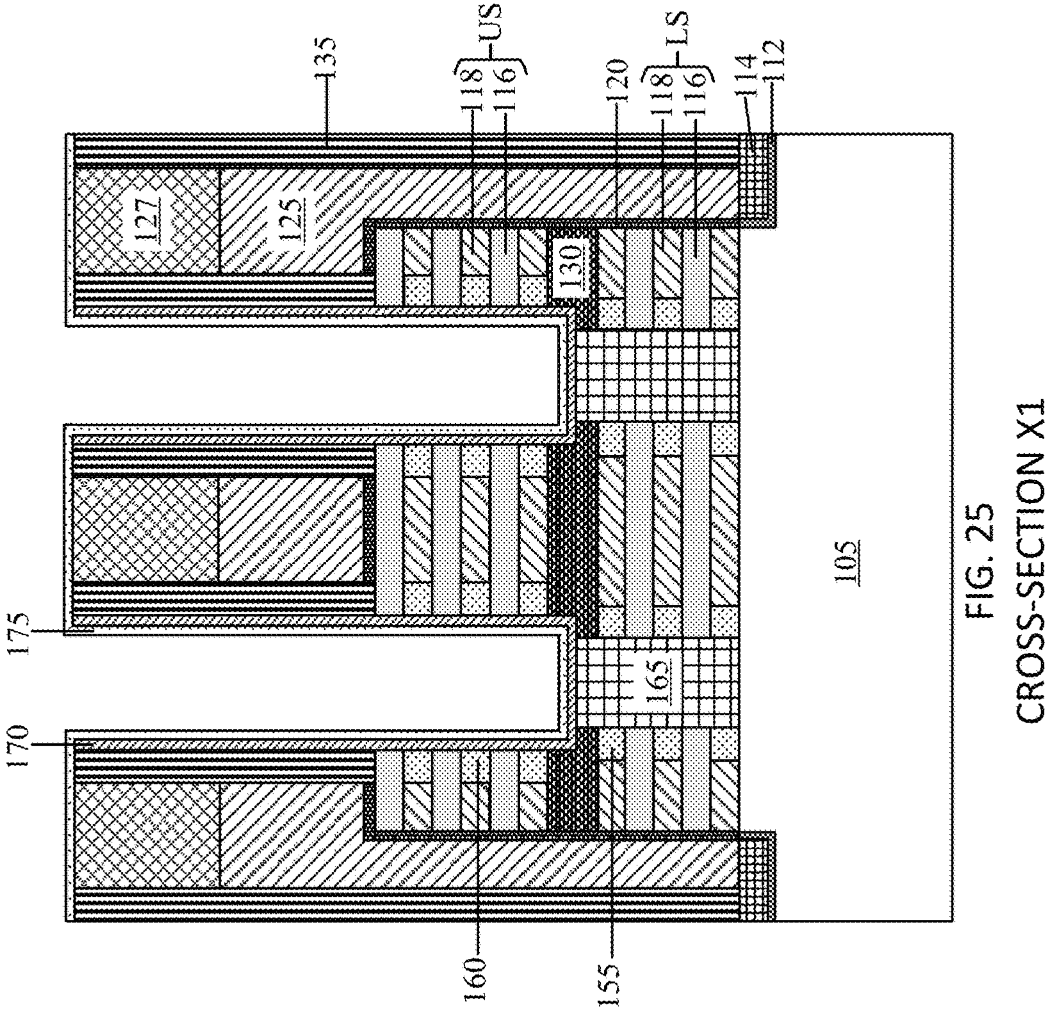
FIG. 25
CROSS-SECTION X1
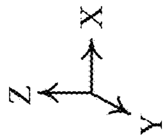

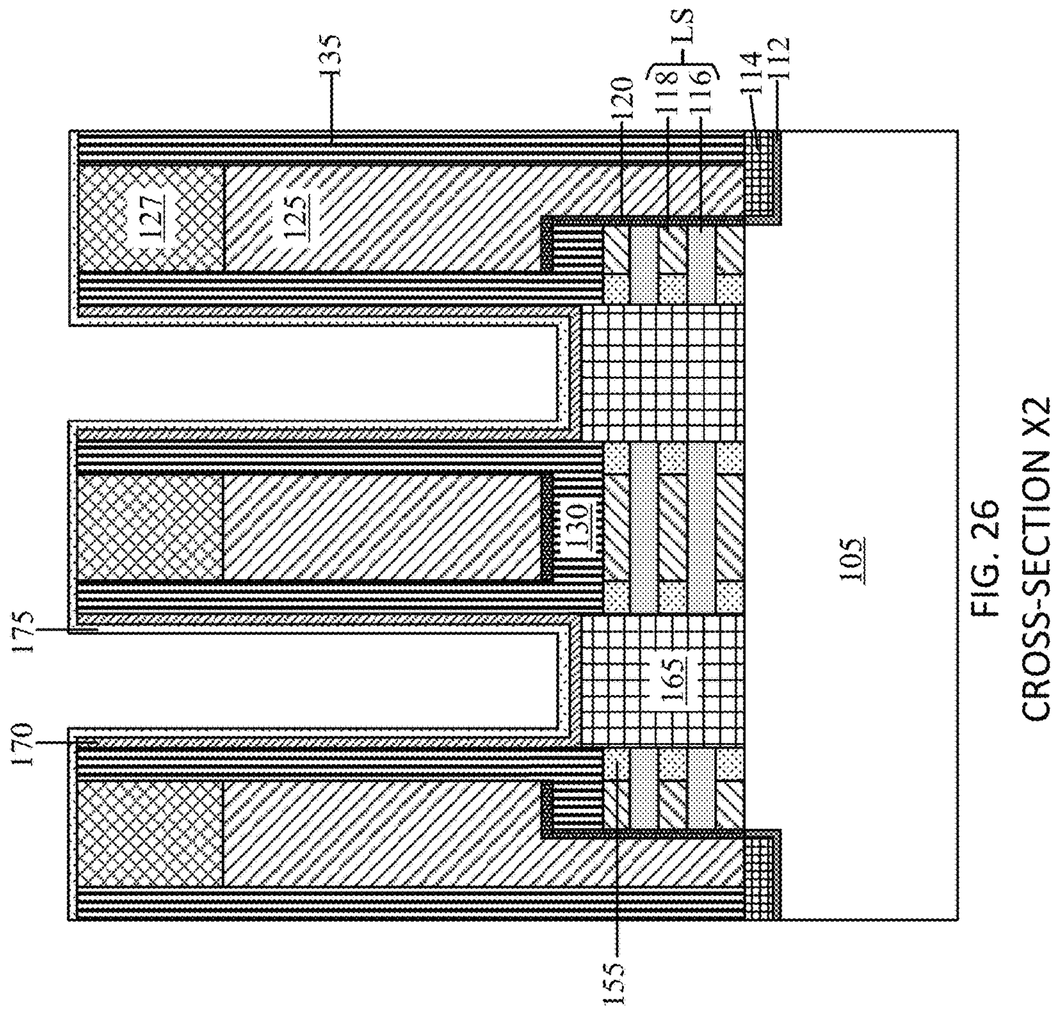
135
LS
120
118
116
114
112
127
125
130
175
170
165
105
155
FIG. 26
CROSS-SECTION X2
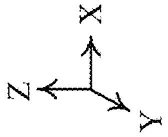
X
Z
Y

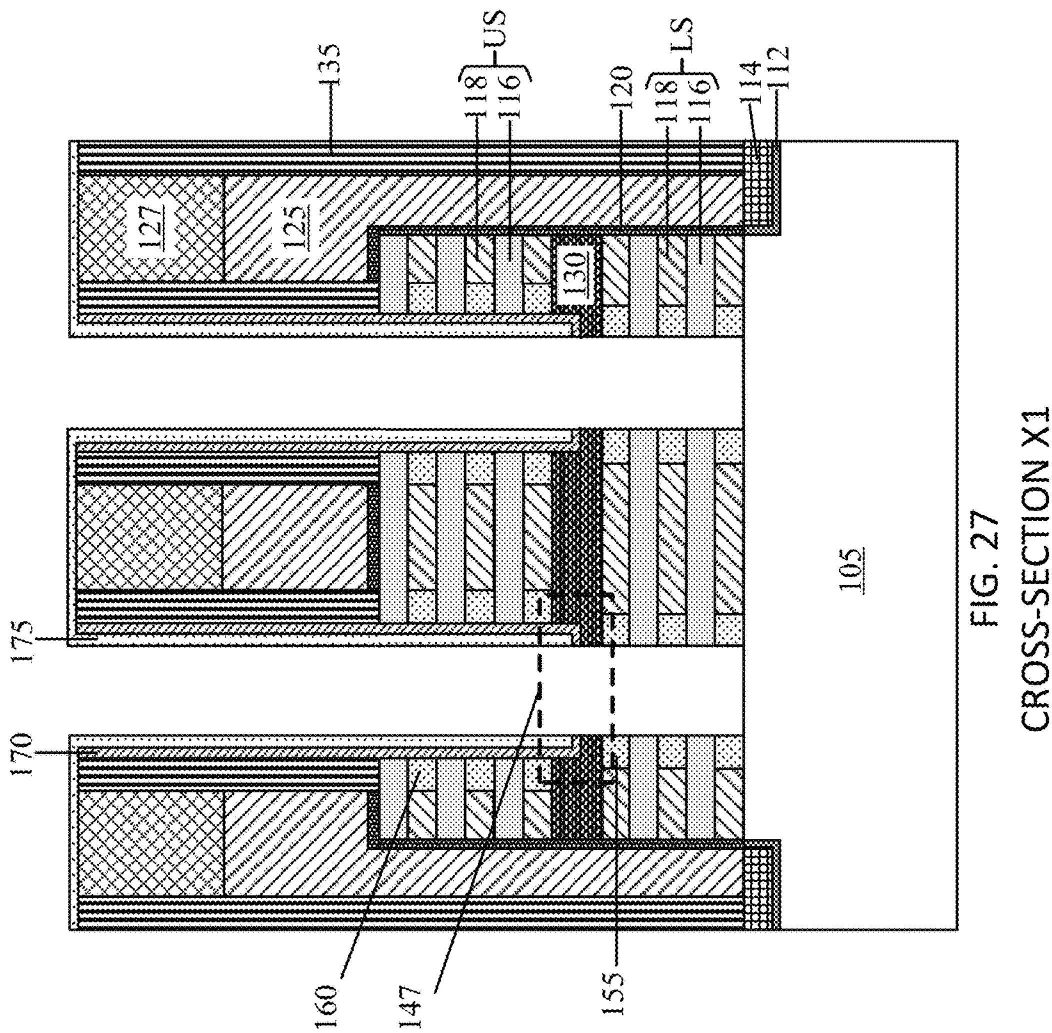
FIG. 27
CROSS-SECTION X1
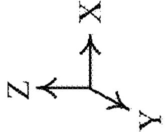

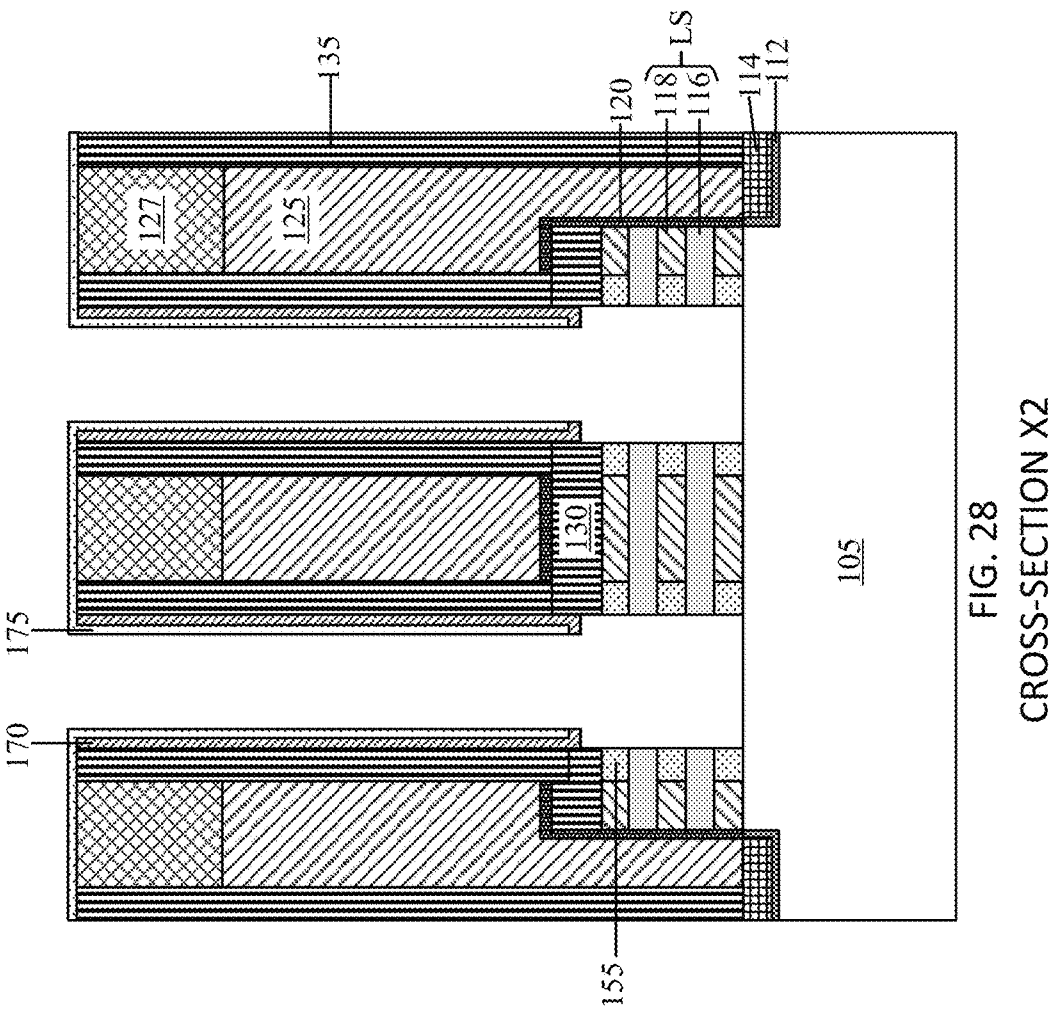
135
LS
118
116
120
114
112
127
125
130
105
175
170
155
FIG. 28
CROSS-SECTION X2
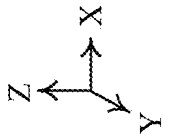
X
Z
Y

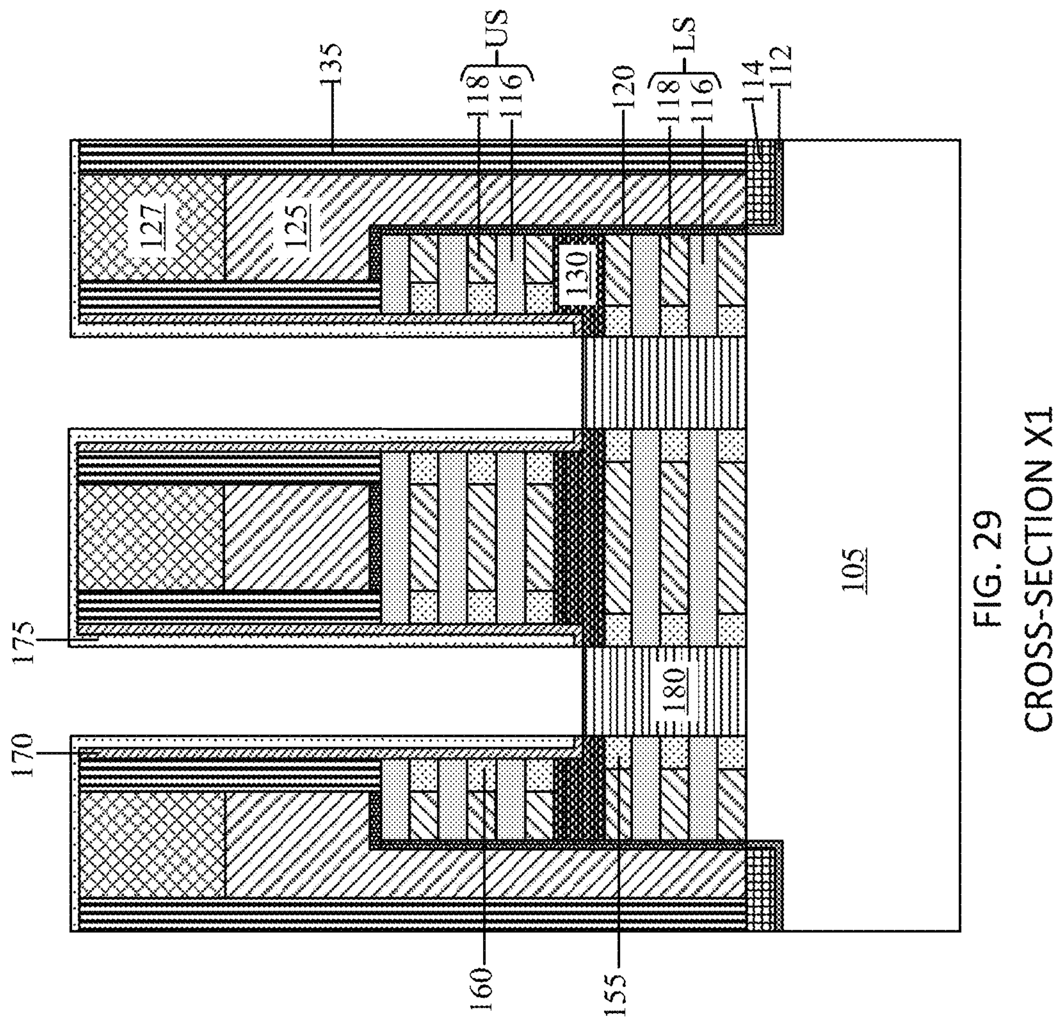
135
118
116
US
120
118
116
LS
114
112
127
125
130
175
170
180
105
160
155
FIG. 29
CROSS-SECTION X1
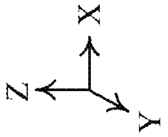
X
Z
Y

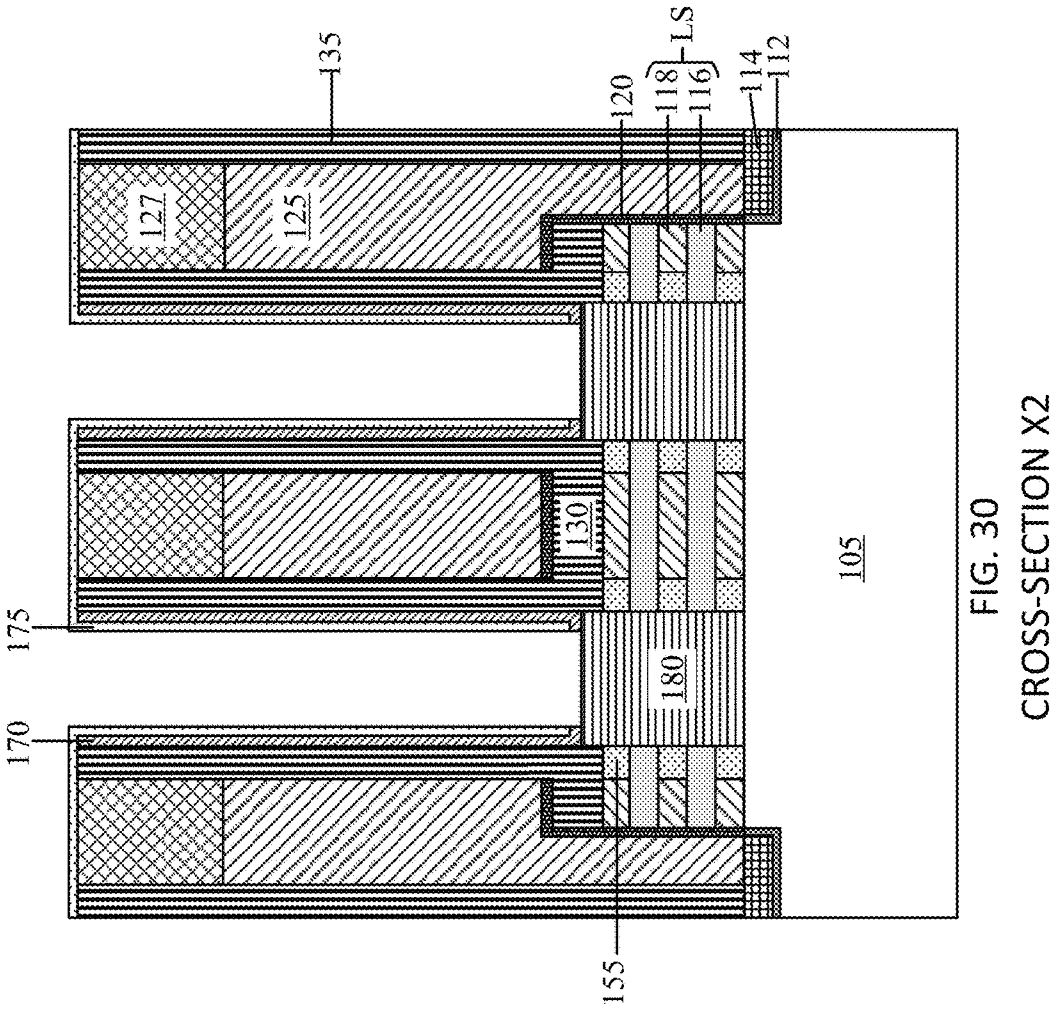
FIG. 30
CROSS-SECTION X2
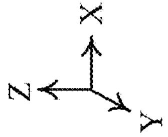

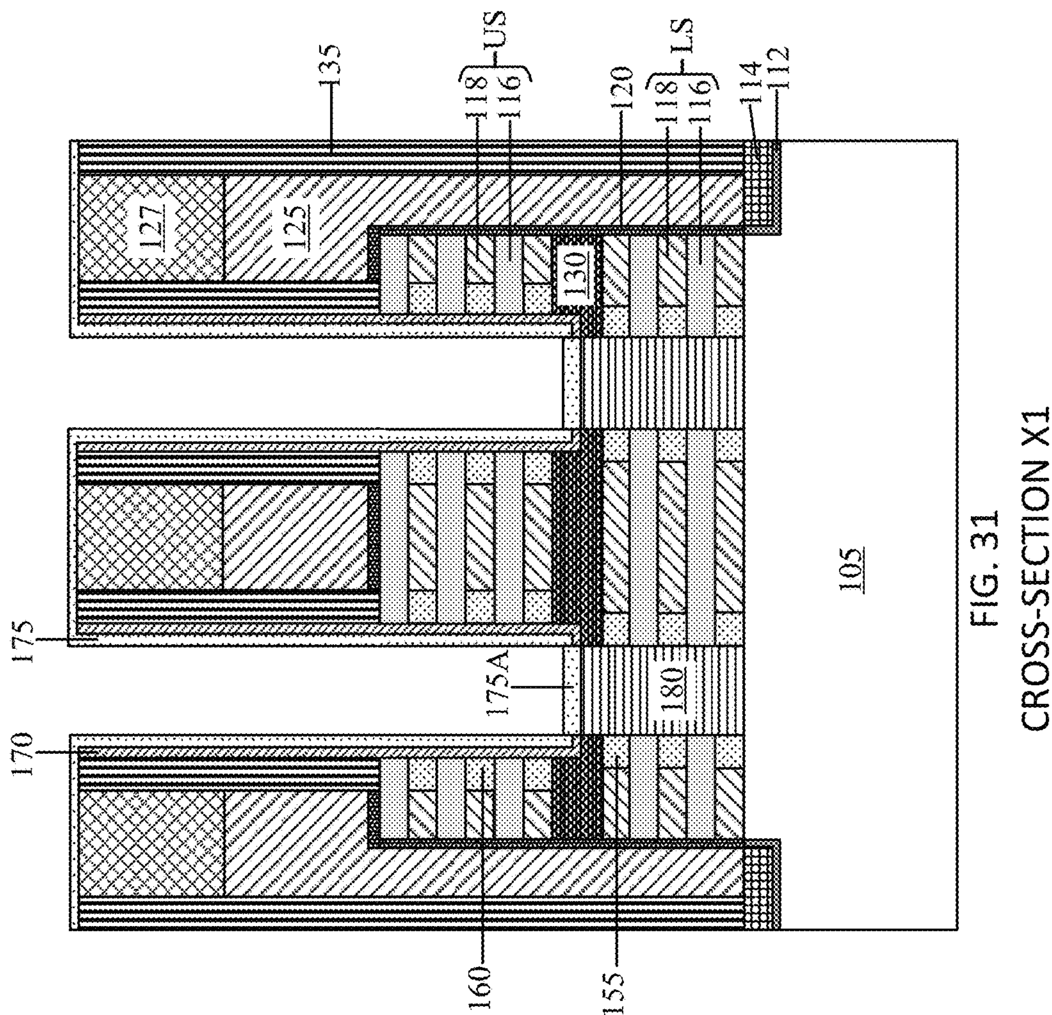
FIG. 31
CROSS-SECTION X1
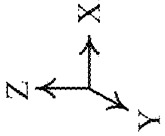

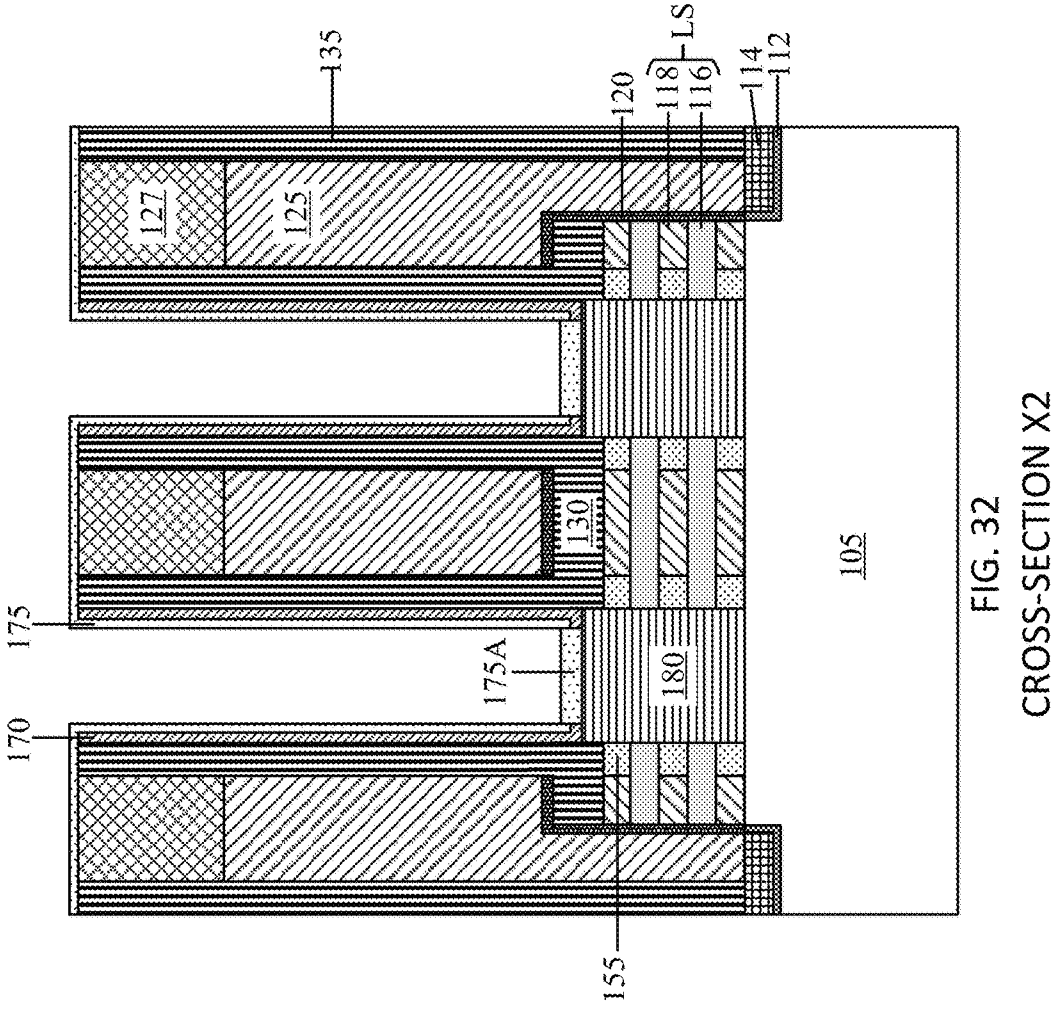
135
LS
120
118
116
114
112
127
125
130
105
175
175A
180
170
155
FIG. 32
CROSS-SECTION X2
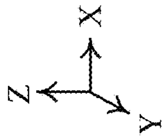
X
Z
Y

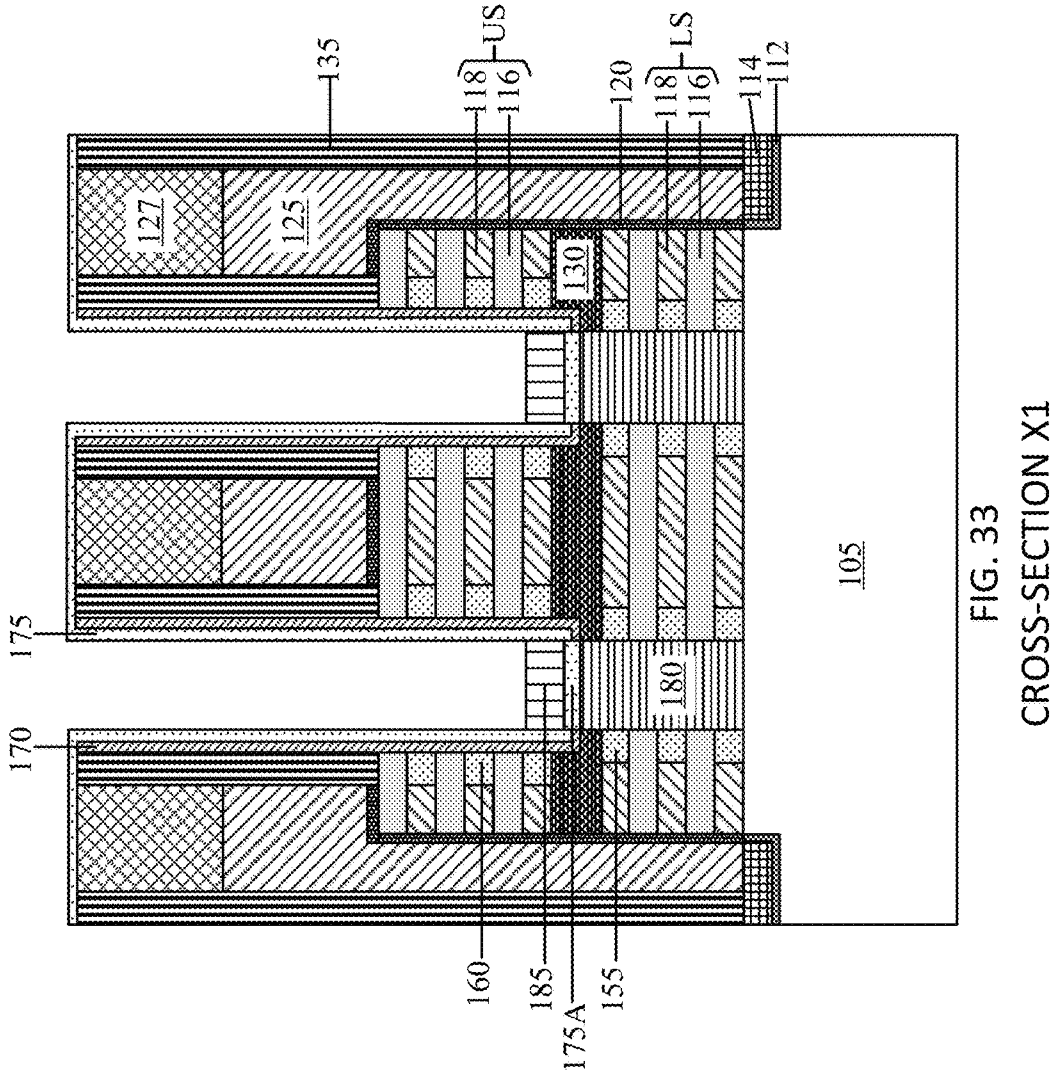
FIG. 33
CROSS-SECTION X1
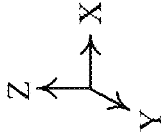

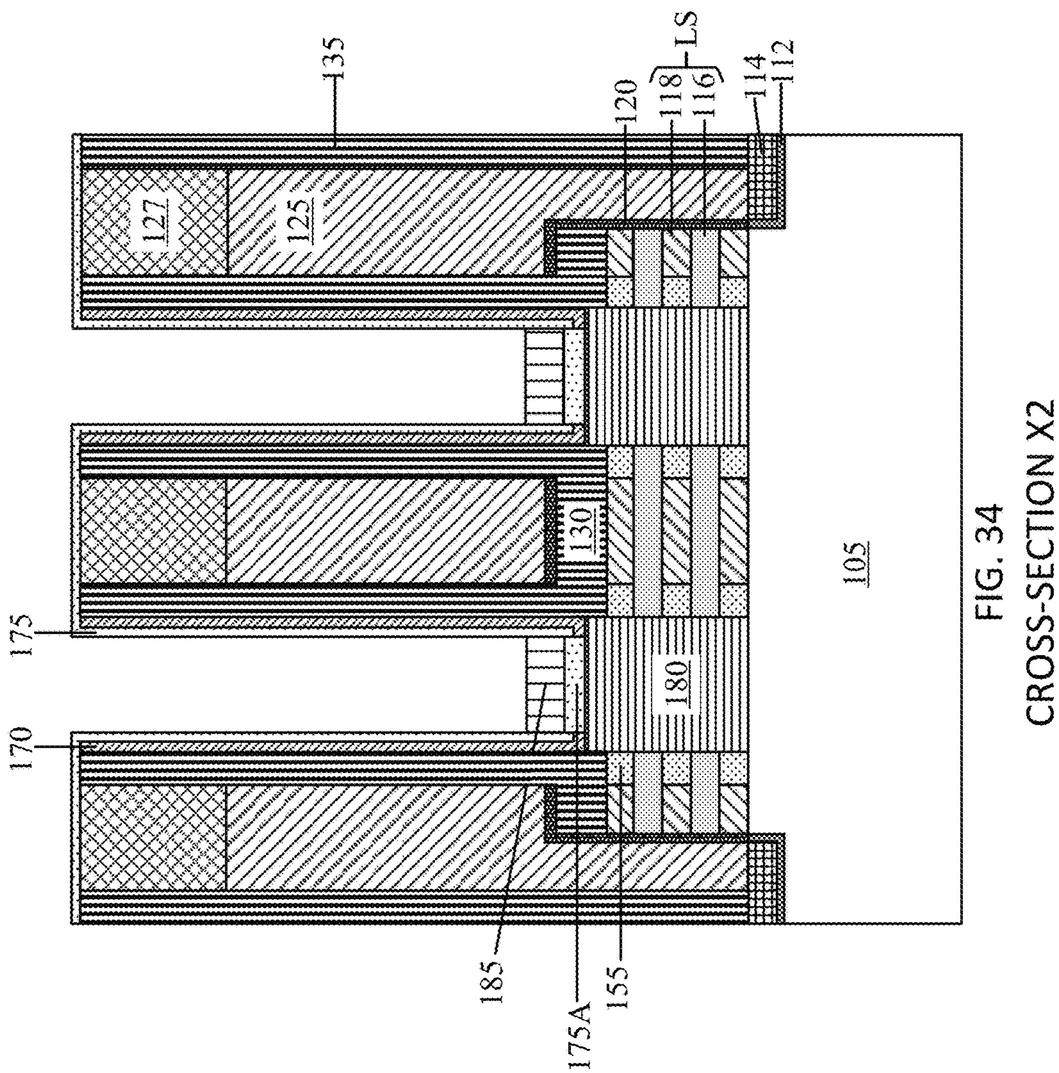
135
LS
120
118
116
114
112
127
125
130
105
180
175
170
185
175A
155
FIG. 34
CROSS-SECTION X2
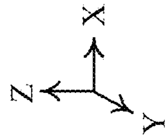
X
Z
Y

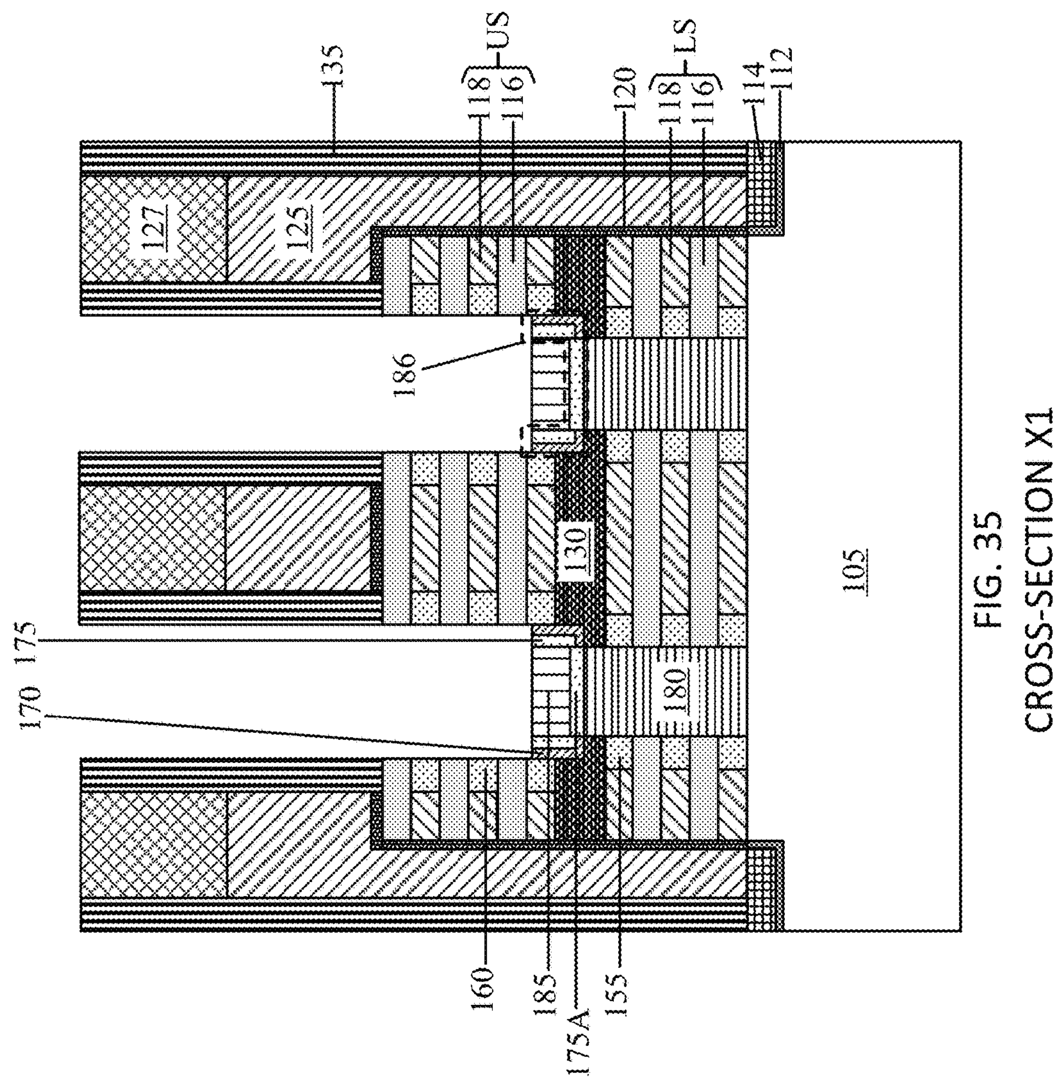
FIG. 35
CROSS-SECTION X1
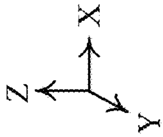

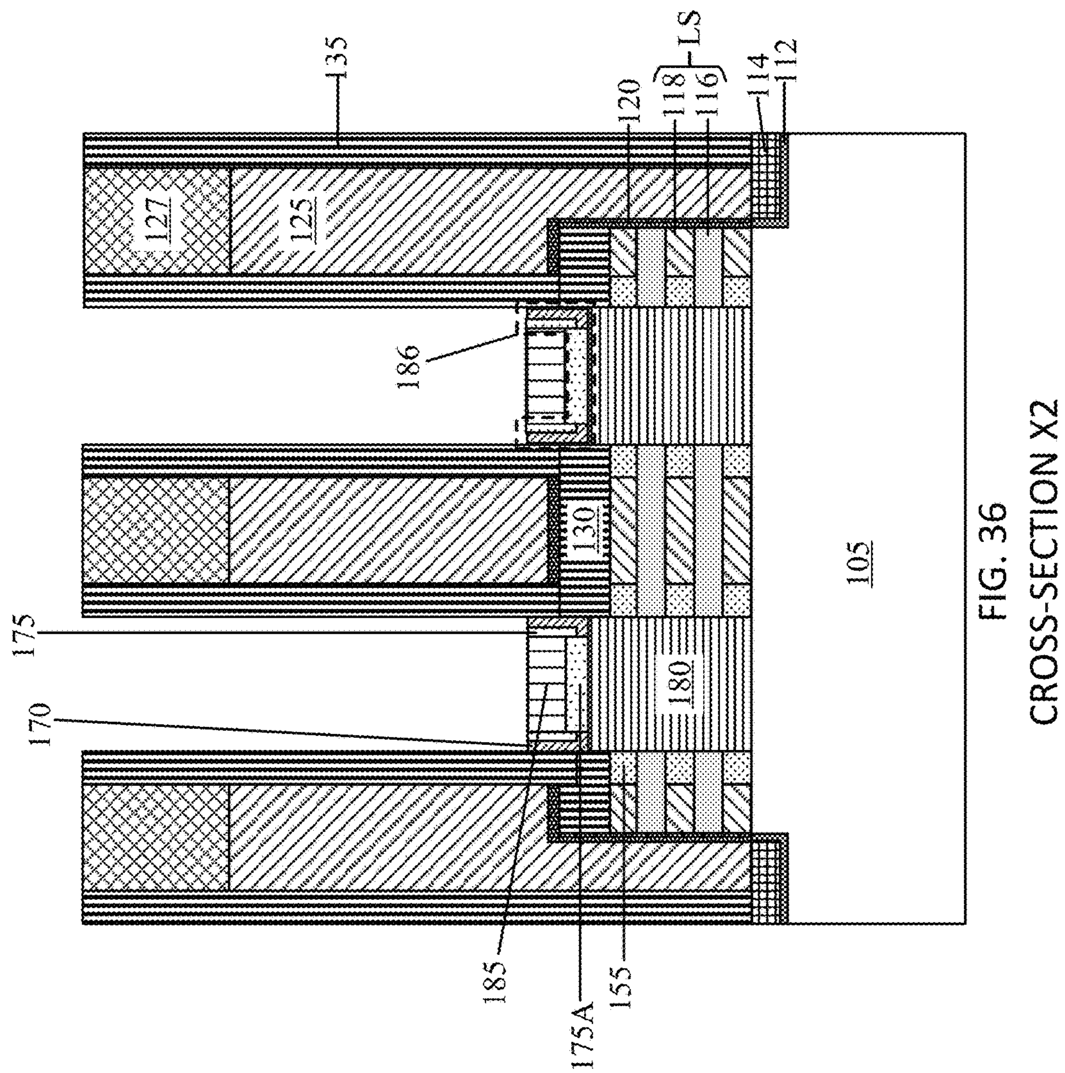
FIG. 36
CROSS-SECTION X2
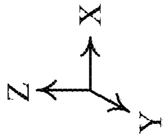

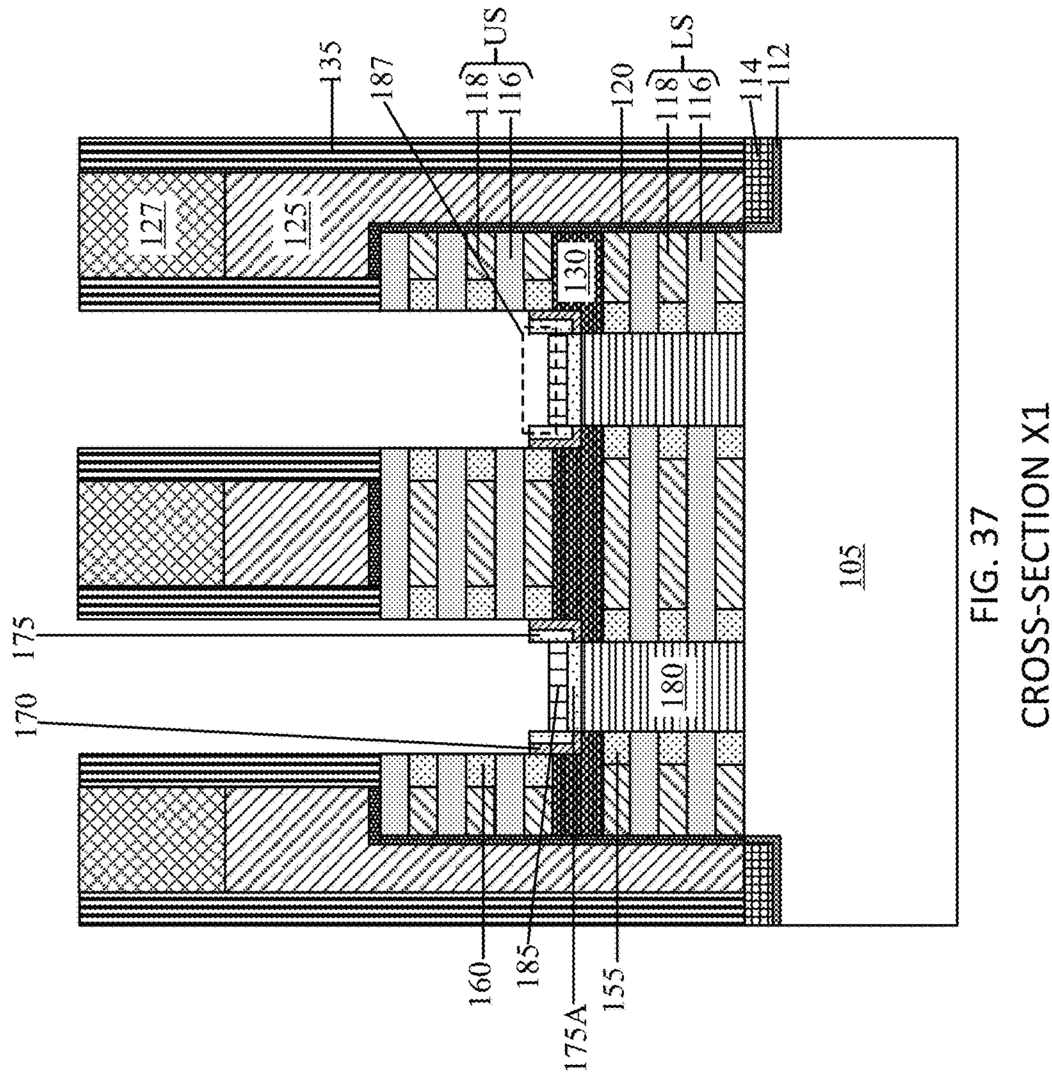
FIG. 37
CROSS-SECTION X1
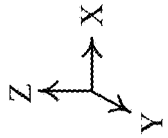

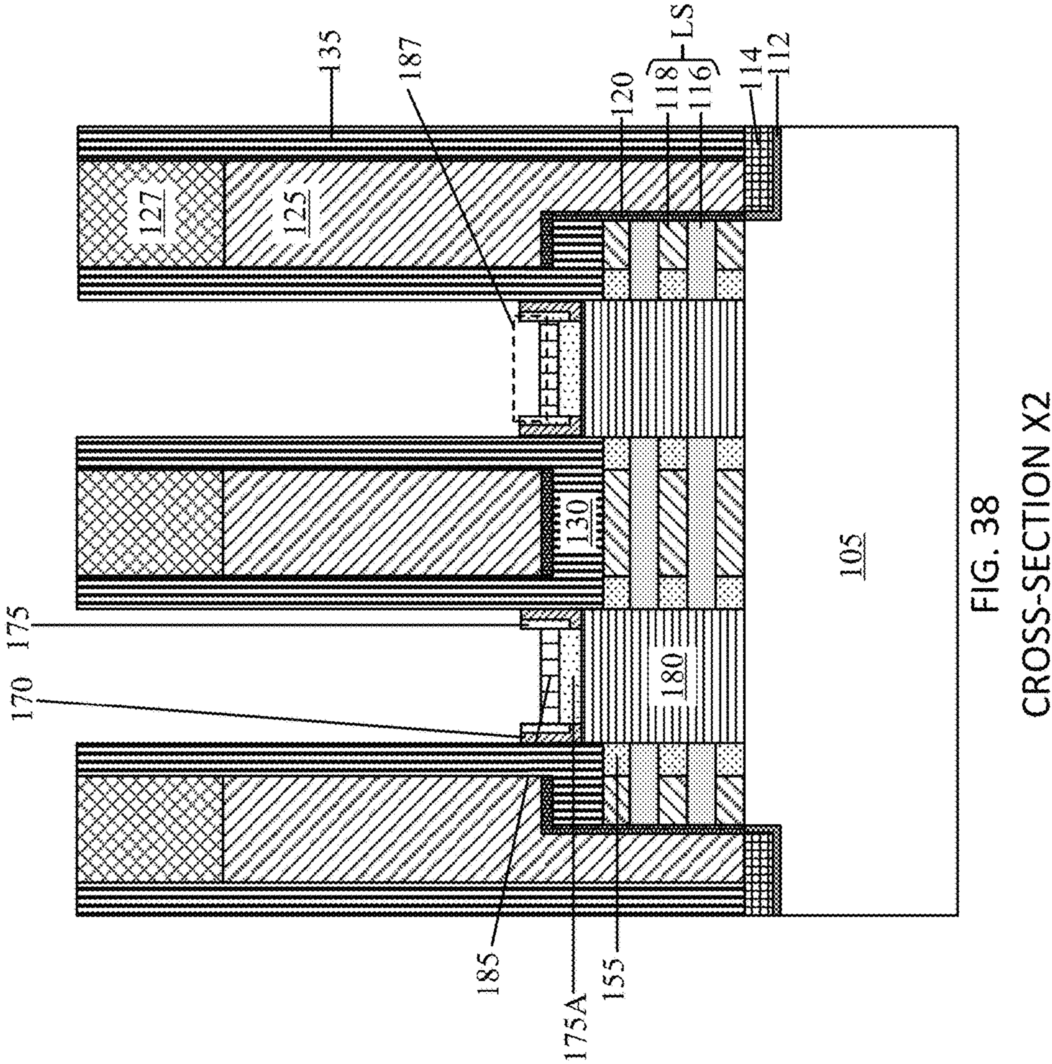
135
187
120
118
116
LS
114
112
127
125
130
105
180
175
170
185
175A
155
FIG. 38
CROSS-SECTION X2
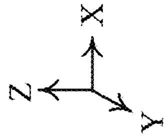
X
Z
Y

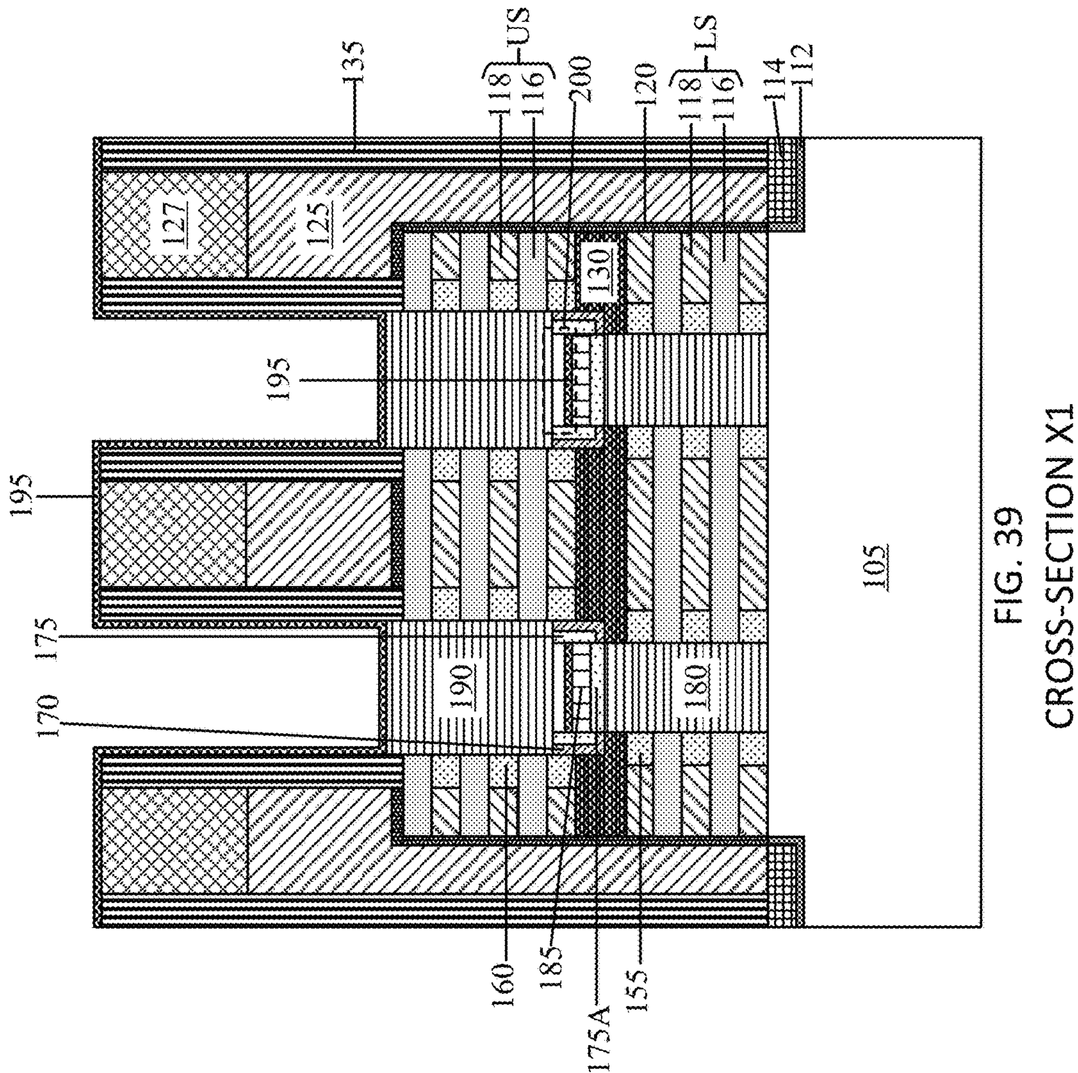
FIG. 39
CROSS-SECTION X1
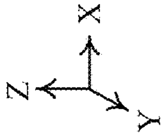

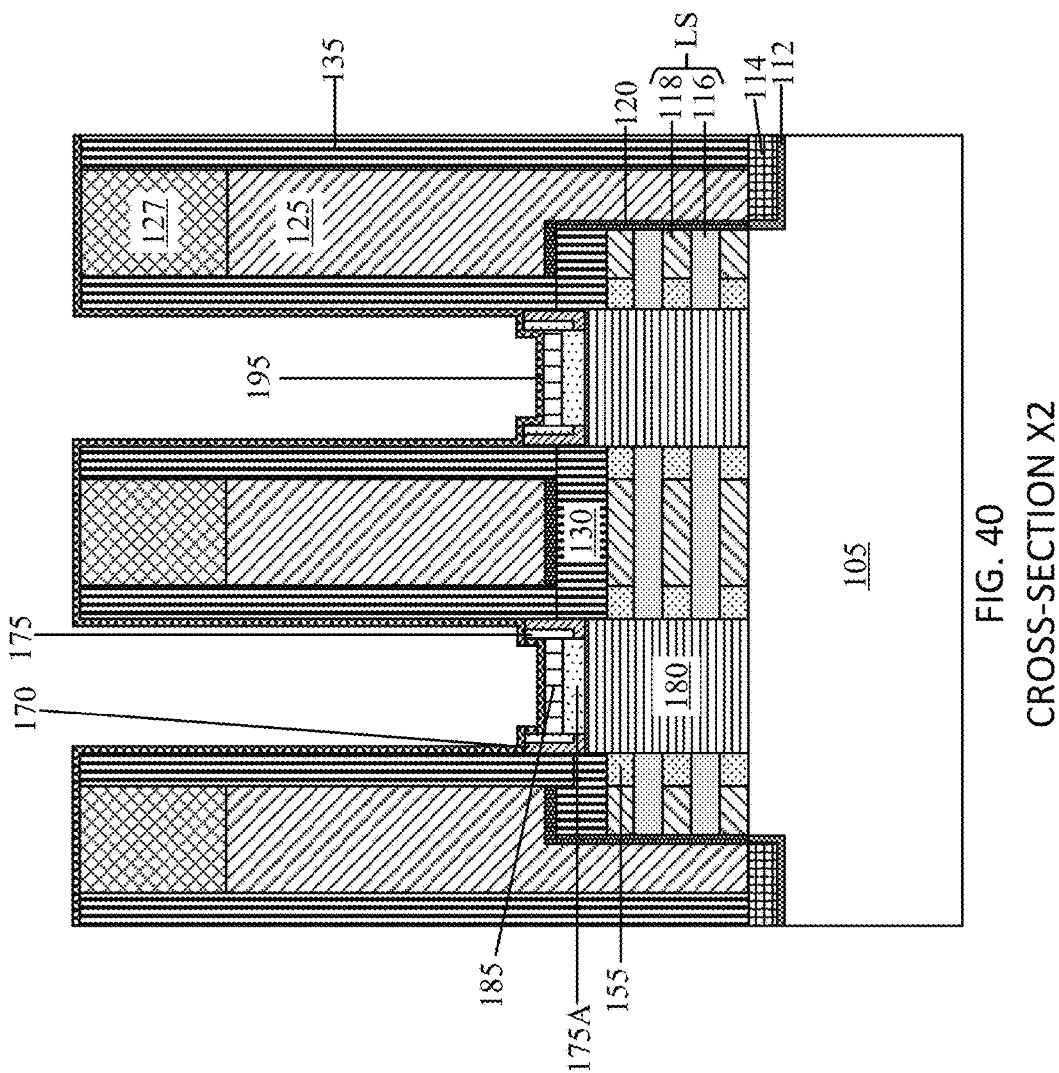
135
LS
120
118
116
114
112
127
125
195
130
175
170
180
105
185
175A
155
FIG. 40
CROSS-SECTION X2
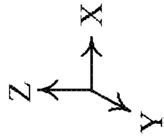
X
Z
Y

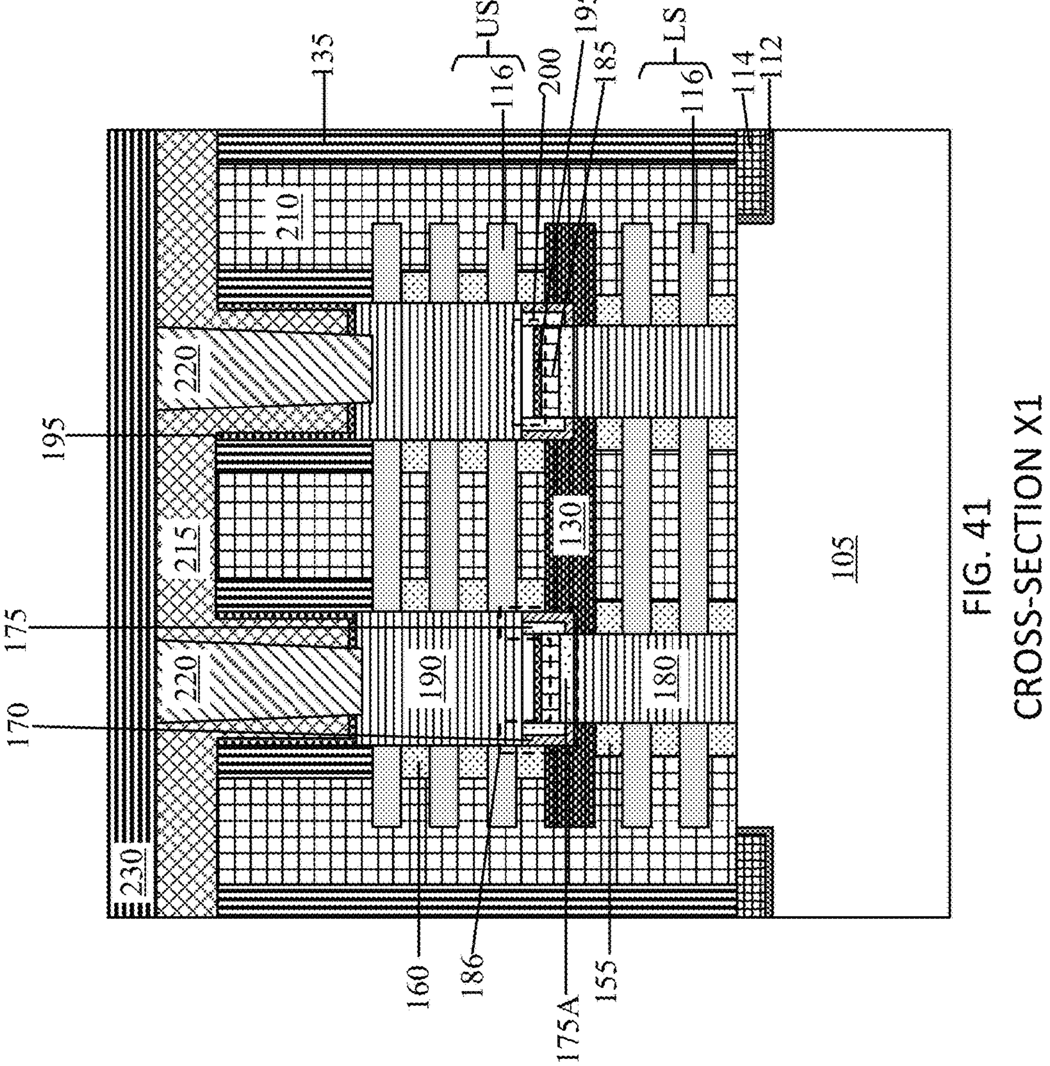
FIG. 41
CROSS-SECTION X1
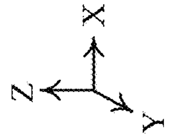

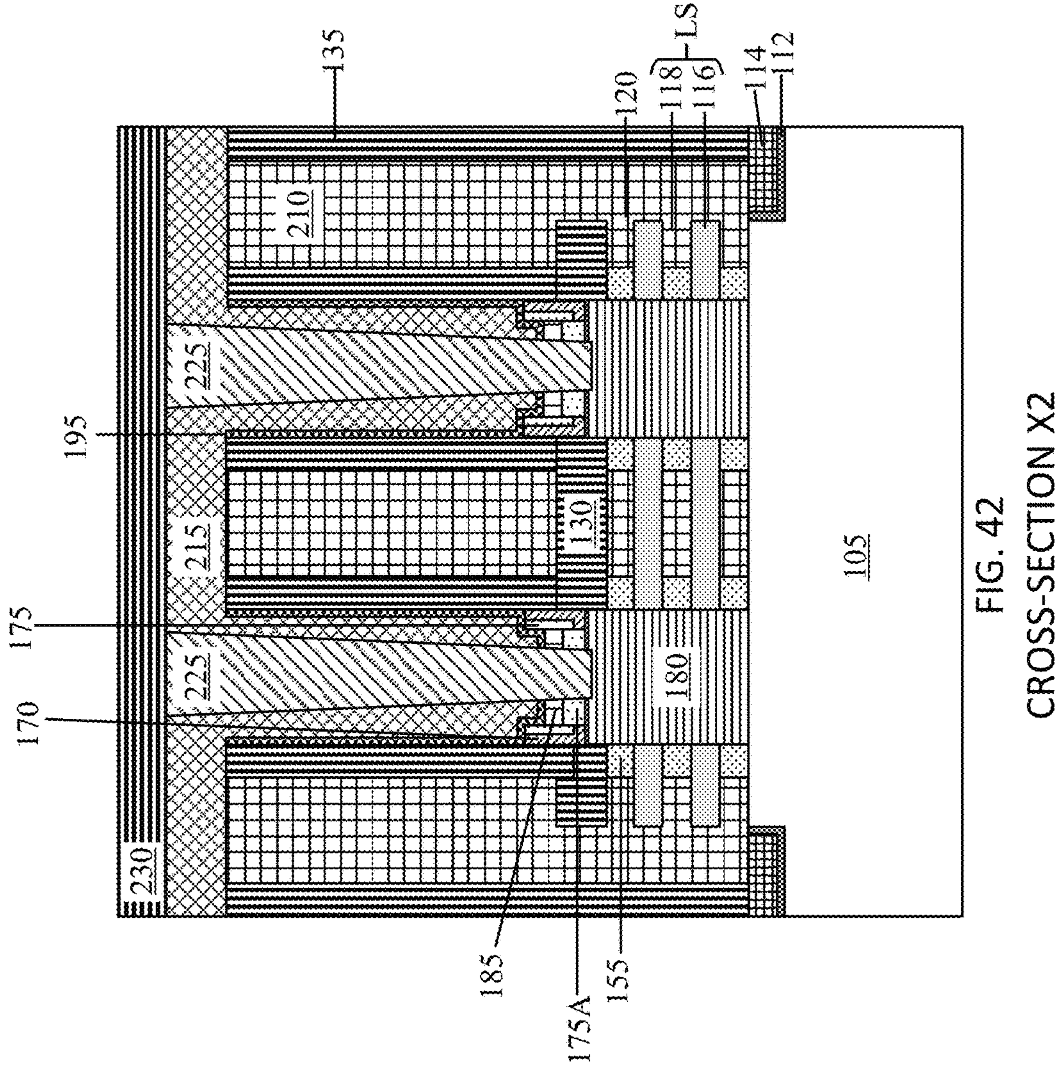
FIG. 42
CROSS-SECTION X2
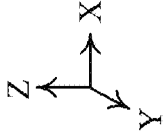

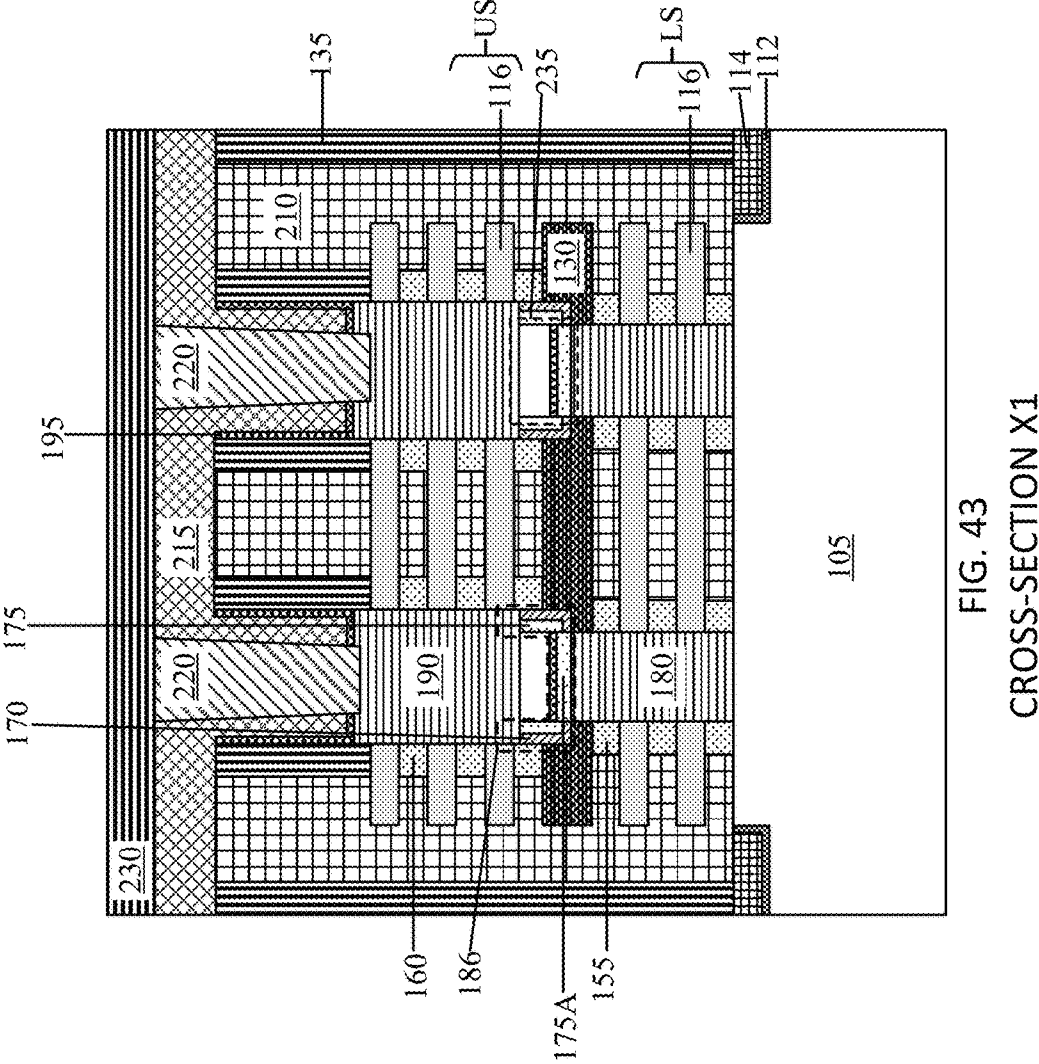
FIG. 43
CROSS-SECTION X1
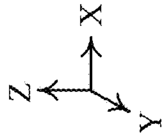

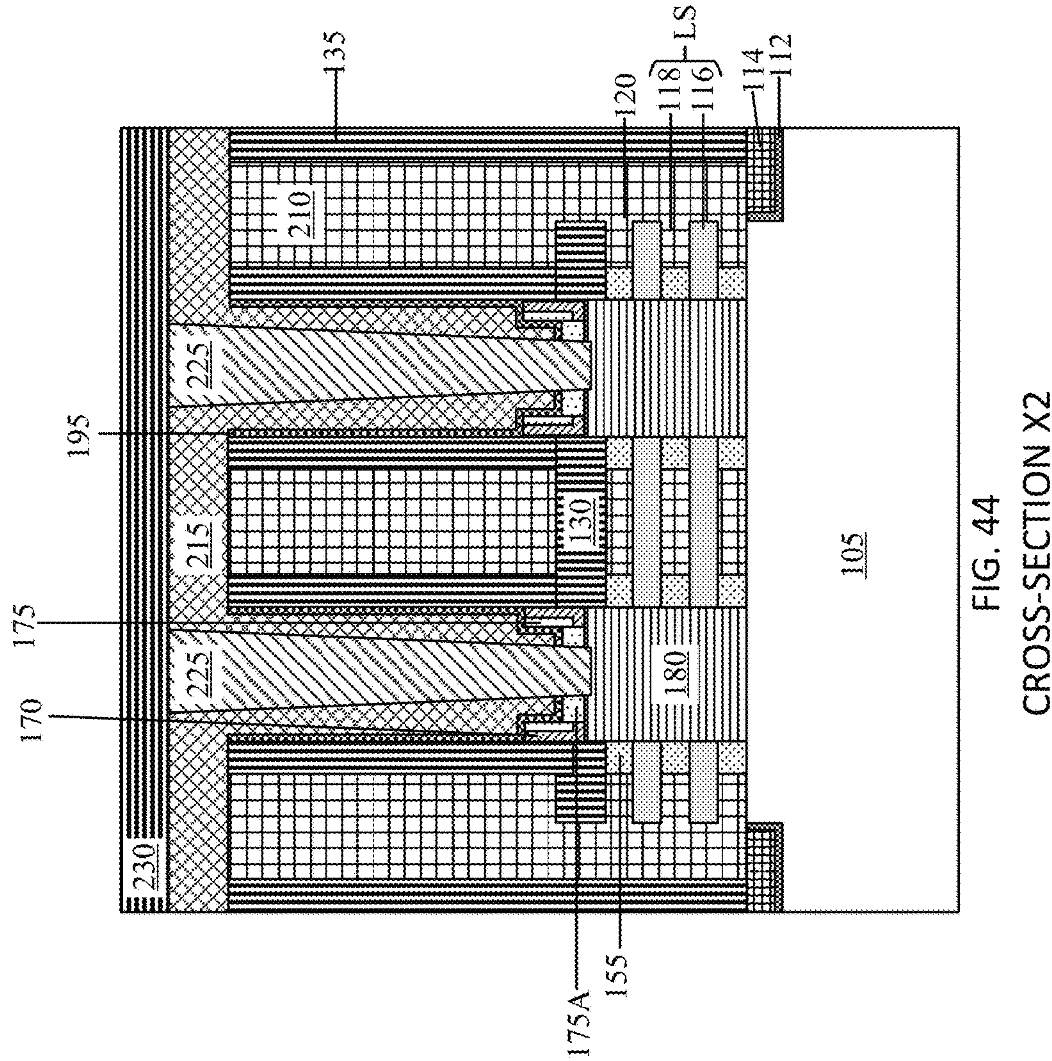
FIG. 44
CROSS-SECTION X2
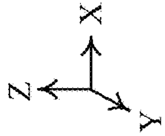

U-SHAPED SPACER TO PROTECT THE INTRA-DEVICE SPACE REGION FOR STACKED FET

BACKGROUND

The present invention generally relates to the field of microelectronics, and more particularly to formation of an airgap between an upper source/drain and the lower source/drain of a stacked FET device.

Nanosheet is the lead device architecture in continuing CMOS scaling. However, nanosheet technology has shown issues when scaling down such that as the devices become smaller and closer together, they are interfering with each other. Isolating upper stack from the lower stack is becoming more important.

BRIEF SUMMARY

Additional aspects and/or advantages will be set forth in part in the description which follows and, in part, will be apparent from the description, or may be learned by practice of the invention.

A microelectronic structure that includes a stack nanosheet transistor comprising a lower nanosheet transistor and an upper nanosheet transistor. The lower nanosheet transistor includes a lower source/drain and the upper nanosheet transistor includes an upper source/drain. An airgap located between the upper source/drain and the lower source/drain. The airgap is vertically aligned with the upper source/drain and the lower source/drain. A first layer located between the airgap and the lower source/drain.

A microelectronic structure that includes a stack nanosheet transistor comprising a lower nanosheet transistor and an upper nanosheet transistor. The lower nanosheet transistor includes a lower source/drain and the upper nanosheet transistor includes an upper source/drain. An airgap located between the upper source/drain and the lower source/drain. The airgap is vertically aligned with the upper source/drain and the lower source/drain. A first liner layer located between the airgap and the lower source/drain. A second liner layer located directly on top of the first liner layer and the second liner layer is located between the airgap and the lower source/drain.

A method that includes the steps of forming a stack nanosheet transistor comprising a lower nanosheet transistor and an upper nanosheet transistor. The lower nanosheet transistor includes a lower source/drain and the upper nanosheet transistor includes an upper source/drain. Forming an airgap located between the upper source/drain and the lower source/drain. The airgap is vertically aligned with the upper source/drain and the lower source/drain. Forming a first layer located between the airgap and the lower source/drain.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 2 illustrates a cross section X1 of the stack of alternating layers of the stacked FET device, in accordance with the embodiment of the present invention.

FIG. 3 illustrates a cross section X2 of the lower stack of the stacked FET device, in accordance with the embodiment of the present invention.

FIG. 4 illustrates a cross section X1 of the stack of alternating layers of the stacked FET device after the removal of the separating sacrificial layer, in accordance with the embodiment of the present invention.

FIG. 5 illustrates a cross section X2 of the lower stack of the stacked FET device after the removal of the separating sacrificial layer, in accordance with the embodiment of the present invention.

FIG. 6 illustrates a cross section X1 of the stack of alternating layers of the stacked FET device after the formation of the spacer layers, in accordance with the embodiment of the present invention.

FIG. 7 illustrates a cross section X2 of the lower stack of the stacked FET device after the formation of the spacer layers, in accordance with the embodiment of the present invention.

FIG. 8 illustrates a cross section X1 of the stack of alternating layers of the stacked FET device after the formation of a first sacrificial fill layer, in accordance with the embodiment of the present invention.

FIG. 9 illustrates a cross section X2 of the lower stack of the stacked FET device after the formation of a first sacrificial fill layer, in accordance with the embodiment of the present invention.

FIG. 10 illustrates a cross section X1 of the stack of alternating layers of the stacked FET device after the removal of the first sacrificial fill layer, in accordance with the embodiment of the present invention.

FIG. 11 illustrates a cross section X2 of the lower stack of the stacked FET device after the pull down of the first sacrificial fill layer, in accordance with the embodiment of the present invention.

FIG. 12 illustrates a cross section X1 of the stack of alternating layers of the stacked FET device after formation of a third liner and an initial etch step, in accordance with the embodiment of the present invention.

FIG. 13 illustrates a cross section X2 of the lower stack of the stacked FET device after formation of a third liner and an initial etch step of the upper stack, in accordance with the embodiment of the present invention.

FIG. 14 illustrates a cross section X1 of the stack of alternating layers of the stacked FET device after etching of the upper stack US into a plurality of columns, in accordance with the embodiment of the present invention.

FIG. 15 illustrates a cross section X1 of the stack of alternating layers of the stacked FET device after removal of the remaining first sacrificial fill layer and the etching of the isolation spacer, in accordance with the embodiment of the present invention.

FIG. 16 illustrates a cross section X2 of the lower stack of the stacked FET device after removal of the remaining first sacrificial fill layer and the etching of the isolation spacer, in accordance with the embodiment of the present invention.

FIG. 17 illustrates a cross section X1 of the stack of alternating layers of the stacked FET device after etching of the alternating layer of the lower stack to form a plurality of columns, in accordance with the embodiment of the present invention.

FIG. 18 illustrates a cross section X2 of the lower stack of the stacked FET device after etching of the alternating layer of the lower stack to form a plurality of columns, in accordance with the embodiment of the present invention.

FIG. 19 illustrates a cross section X1 of the stack of alternating layers of the stacked FET device after etching/recessing of the sacrificial layers of the upper stack and the sacrificial layers of the lower stack, in accordance with the embodiment of the present invention.

FIG. 20 illustrates a cross section X2 of the lower stack of the stacked FET device after etching/recessing of the sacrificial layers of the upper stack and the sacrificial layers of the lower stack, in accordance with the embodiment of the present invention.

FIG. 21 illustrates a cross section X1 of the stack of alternating layers of the stacked FET device after formation of a lower inner spacer and an upper inner spacer, in accordance with the embodiment of the present invention.

FIG. 22 illustrates a cross section X2 of the lower stack of the stacked FET device after formation of a lower inner spacer and an upper inner spacer, in accordance with the embodiment of the present invention.

FIG. 23 illustrates a cross section X1 of the stack of alternating layers of the stacked FET device after formation of a second sacrificial fill layer, in accordance with the embodiment of the present invention.

FIG. 24 illustrates a cross section X2 of the lower stack of the stacked FET device after formation of a second sacrificial fill layer, in accordance with the embodiment of the present invention.

FIG. 25 illustrates a cross section X1 of the stack of alternating layers of the stacked FET device after formation of a fourth liner and a fifth liner, in accordance with the embodiment of the present invention.

FIG. 26 illustrates a cross section X2 of the lower stack of the stacked FET device after formation of a fourth liner and a fifth liner, in accordance with the embodiment of the present invention.

FIG. 27 illustrates a cross section X1 of the stack of alternating layers of the stacked FET device after etching of a portion of the fourth liner and fifth liner, and the removal of the second sacrificial fill layer, in accordance with the embodiment of the present invention.

FIG. 28 illustrates a cross section X2 of the lower stack of the stacked FET device after etching of a portion of the fourth liner and fifth liner, and the removal of the second sacrificial fill layer, in accordance with the embodiment of the present invention.

FIG. 29 illustrates a cross section X1 of the stack of alternating layers of the stacked FET device after formation of the lower source/drain, in accordance with the embodiment of the present invention.

FIG. 30 illustrates a cross section X2 of the lower stack of the stacked FET device after formation of the lower source/drain, in accordance with the embodiment of the present invention.

FIG. 31 illustrates a cross section X1 of the stack of alternating layers of the stacked FET device after formation of a sixth liner, in accordance with the embodiment of the present invention.

FIG. 32 illustrates a cross section X2 of the lower stack of the stacked FET device after formation of a sixth liner, in accordance with the embodiment of the present invention.

FIG. 33 illustrates a cross section X1 of the stack of alternating layers of the stacked FET device after formation of a third sacrificial fill layer, in accordance with the embodiment of the present invention.

FIG. 34 illustrates a cross section X2 of the lower stack of the stacked FET device after formation of a third sacrificial fill layer, in accordance with the embodiment of the present invention.

FIG. 35 illustrates a cross section X1 of the stack of alternating layers of the stacked FET device after removal of most of the fourth liner and the fifth liner, in accordance with the embodiment of the present invention.

FIG. 36 illustrates a cross section X2 of the lower stack of the stacked FET device after removal of most of the fourth liner and the fifth liner, in accordance with the embodiment of the present invention.

FIG. 37 illustrates a cross section X1 of the stack of alternating layers of the stacked FET device after recessing of the third sacrificial fill layer, in accordance with the embodiment of the present invention.

FIG. 38 illustrates a cross section X2 of the lower stack of the stacked FET device after recessing of the third sacrificial fill layer, in accordance with the embodiment of the present invention.

FIG. 39 illustrates a cross section X1 of the stack of alternating layers of the stacked FET device after formation of the upper source/drain and the formation of a seventh liner, in accordance with the embodiment of the present invention.

FIG. 40 illustrates a cross section X2 of the lower stack of the stacked FET device after formation of the upper source/drain and the formation of a seventh liner, in accordance with the embodiment of the present invention.

FIG. 41 illustrates a cross section X1 of the stack of alternating layers of the stacked FET device after formation of a gate, a frontside interlayer dielectric layer, frontside upper source/drain contacts, and a power distribution network, in accordance with the embodiment of the present invention.

FIG. 42 illustrates a cross section X2 of the lower stack of the stacked FET after formation of a gate, a frontside interlayer dielectric layer, frontside lower source/drain contacts, and a power distribution network, in accordance with the embodiment of the present invention.

FIG. 43 illustrates a cross section X1 of the stack of alternating layers of the stacked FET device after formation of a gate, a frontside interlayer dielectric layer, frontside upper source/drain contacts, and a power distribution network, in accordance with the embodiment of the present invention.

FIG. 44 illustrates a cross section X2 of the lower stack of the stacked FET after formation of a gate, a frontside interlayer dielectric layer, frontside lower source/drain contacts, and a power distribution network, in accordance with the embodiment of the present invention.

DETAILED DESCRIPTION

Figure 1:
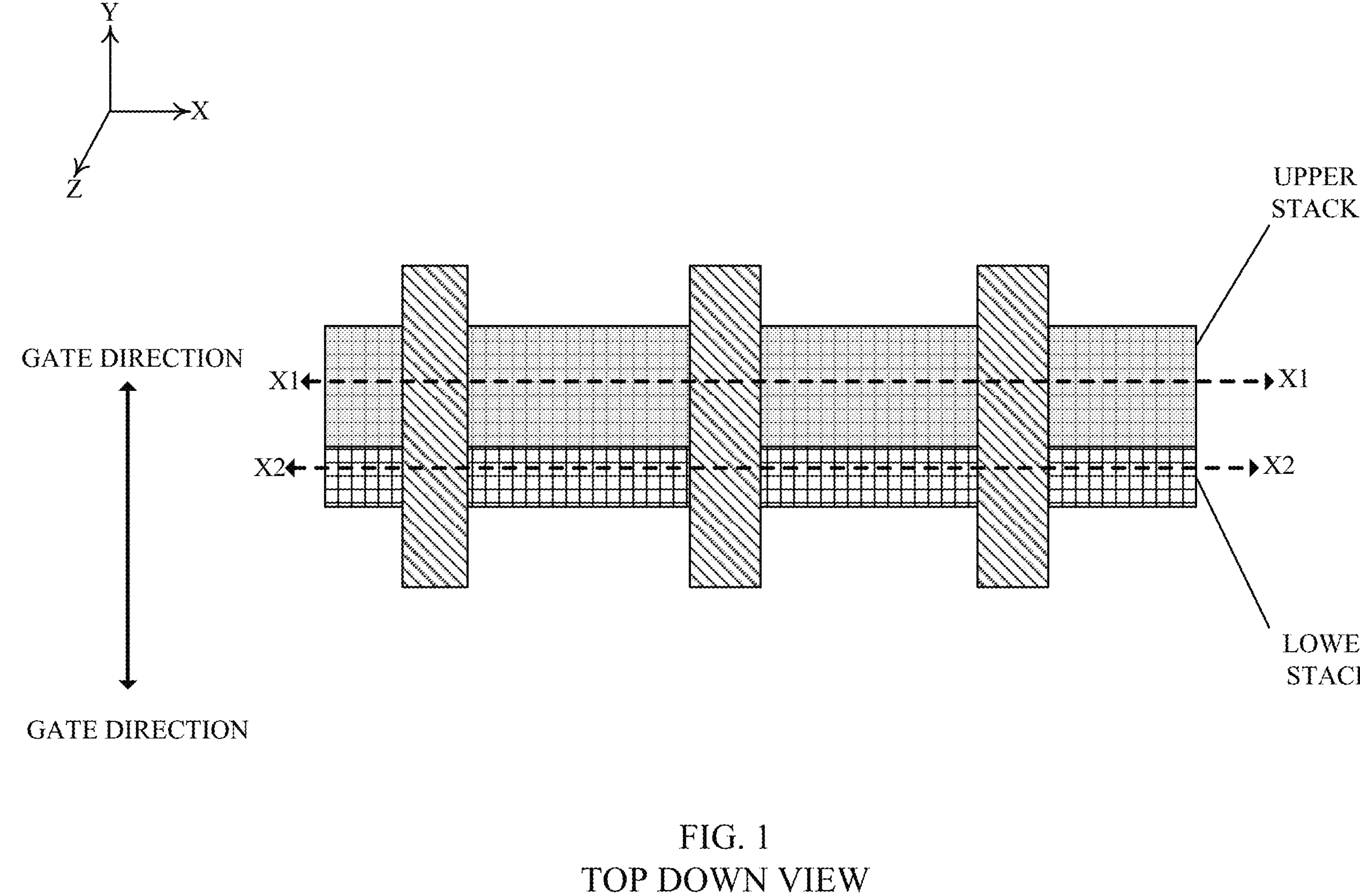
FIG. 1 illustrates a top-down view of multiple stacked nano devices (stacked nanosheet transistors), in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of +8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will be packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. Stack FETs are comprised of a lower nanosheet transistor (or device) and an upper nanosheet transistor (or device) where contacts need to be formed to the source/drain of each of the devices. The present invention is directed towards the formation of an airgap between the upper source/drains and the lower source/drains. A U-shaped layer is formed between the upper source/drain and the lower source/drain, where the U-shaped layer can be comprised of, for example, SiN. The air gap is located within the boundaries of the U-shaped layer, such that the upper source/drain forms the upper boundary so the airgap while the U-shaped layer forms the side and bottom boundaries of the airgap. Optionally, an oxide layer can be located on the U-shaped layer, such that the oxide layer forms the bottom boundary of the airgap so that the airgap is located between the upper source/drain and the oxide layer.

FIG. 1 illustrates a top-down view of multiple stacked nano devices, or stacked nanosheet transistors, which can be comprised of electronic components such as transistors, in accordance with the embodiment of the present invention. The cross-section X1 extends horizontally through the stack/row of a plurality of nanostack FET devices (or stacked nanosheet transistors), where the cross-section is perpendicular to the gate direction. Cross-section X1 extends through the upper and lower stacked nano devices. The cross-section X2 extends horizontally through the lower stack/row of a plurality of stack nanostack FET devices (or stacked nanosheet transistors), where the cross-section is perpendicular to the gate direction.

Referring now to FIGS. 2, and 3, a structure is shown during an intermediate step of a method of fabricating stacked nano devices, such as, a stacked nanosheet transistor structure after formation of the alternating layers that will form the stacked nano device, according to an embodiment of the invention.

FIGS. 2, and 3 illustrate the processing stage of the structure after separating the alternating layers to form adjacent nanostack (nanosheet) columns. FIG. 2 illustrates a substrate 105, a lower stack LS, an upper stack US, a separating sacrificial layer 110.

The substrate can be, for example, a material including, but not necessarily limited to, silicon (Si), silicon germanium (SiGe), Si: C (carbon doped silicon), carbon doped silicon germanium (SiGe: C), III-V, II-V compound semiconductor or another like semiconductor. In addition, multiple layers of the semiconductor materials can be used as the semiconductor material of the substrate 105. In some embodiments, substrate 105 includes both semiconductor materials and dielectric materials. The semiconductor substrate 105 may also comprise an organic semiconductor or a layered semiconductor such as, for example, Si, SiGe, a silicon-on-insulator or a SiGe-on-insulator. A portion or the entire semiconductor substrate 105 may also be comprised of an amorphous, polycrystalline, or monocrystalline. The semiconductor substrate 105 may be doped, undoped or contain doped regions and undoped regions therein.

The separating sacrificial layer 110 is located between the lower stack LS and the upper stack US. The separating sacrificial layer 110 can be comprised of, for example, SiGe, where Ge is in the range of about 45% to 70%. The high percentage of Ge in the separating sacrificial layer 110 allows for selective targeting of the separating sacrificial layer 110 over the plurality of sacrificial layers 118 that are included in the alternating layers of the lower stack LS and the upper stack US. The lower stack LS is comprised of alternating layers of channel layers 116 and sacrificial layers 118. The upper stack US is comprised of alternating layers of channel layers 116 and sacrificial layers 118. The sacrificial layers 118 located in the lower stack LS and the upper stack US can be comprised of, for example, SiGe, where Ge is in the range of about 15% to 35%. Channel layers 116 located in the lower stack LS and the upper stack US are nanosheets comprised of, for example, Si.

A plurality of trenches (not shown) were formed in substrate 105 and filled in with a first liner 112 and a first fill layer 114. The first liner 112 can be comprised of, for example, SiN. The first fill layer 114 can be comprised of, for example, an oxide layer. A second liner 120 is formed on the outer layer of the stack of alternating layers. Dummy gate 125 is formed on and around the stack of alternating layers. A hardmask 127 is formed on top of dummy gate 125. Hardmask 127 and dummy gate 125 are patterned to form a plurality of columns.

FIGS. 4 and 5 illustrate the processing stage of the structure after the removal of the separating sacrificial layer 110. The separating sacrificial layer 110 is selectively removed to create a space between the upper stack US and the lower stack LS. FIGS. 6 and 7 illustrate the processing stage of the structure after the formation of the spacer layers 130 and 135. The space/void caused by the removal of the separating sacrificial layer 110 is filled in with a spacer material to form the isolation spacer 130. Gate spacer 135 is formed along the external/exposed surfaces of the alternating stack. Gate spacer 135 is formed along the sidewalls of the dummy gate 125, the hardmask 127, and along the horizontal top surface of the hardmask 127. Gate spacer 135 is further formed on top of the top layer of the upper stack US that was exposed by the patterning of the dummy gate 125 and the hardmask 127. As illustrated in FIG. 7, gate spacer 135 can be in contact with the isolation spacer 130.

FIGS. 8 and 9 illustrate the processing stage of the structure after the formation of a first sacrificial fill layer 140. A first sacrificial fill layer 140 is located between the columns comprised of the dummy gate 125, the hardmask 127, and the gate spacer 135. The first sacrificial fill layer 140 is located on top of a horizontal section of gate spacer 135 and on top of the isolation spacer 130. The first sacrificial fill layer 140 can be comprised of, for example, SOG.

FIGS. 10 and 11 illustrate the processing stage of the structure after the first sacrificial fill layer 140 is pulled down. The first sacrificial fill layer 140 is pulled down such that the first sacrificial layer 140 is removed in some areas and remains in other areas. As illustrated in FIG. 10, the first sacrificial fill layer 140 is removed from the top of the stack of alternating layers, causing the horizontal sections of gate spacer 135 to be exposed. FIG. 11 illustrates that a portion of the first sacrificial fill layer 140 remains between the columns comprised of the dummy gate 125, the hardmask 127, and the gate spacer 135. The remaining portion of the first sacrificial fill layer 140 is located on top of the isolation spacer 130. FIG. 11 illustrates a portion of the lower stack LS that extends beyond the edge of the upper stack US, thus the first sacrificial fill layer 140 protects the lower stack LS from being etched during the etching of the upper stack US.

FIGS. 12 and 13 illustrate the processing stage of the structure after formation of a third liner 145 and an initial etch step of the upper stack US. A third liner 145 is formed on the sidewalls of the gate spacer 135 to protect the vertical sections of the gate spacer 135 from the etching of the horizontal sections of the gate spacer 135. The horizontal sections of gate spacer 135 located on top of the upper stack US are etched to exposed portions of the top layer of the upper stack US. The first sacrificial fill layer 140 protects the isolation spacer 130 from being etched during the initial etching process, as illustrated in FIG. 13.

FIG. 14 illustrates the processing stage of the structure after etching of the upper stack US into a plurality of columns. The alternating layers of the upper stack US are etched, and the upper stack US is separated into a plurality of columns. The separating of the upper stack US into a plurality of columns allows for the formation of the upper source/drain regions that are located between the columns. The etching process exposes portions of the isolation spacer 130. The remaining portions of the first sacrificial fill layer 140 protects the portion of the lower stack LS that extends beyond the upper stack from being etched.

FIGS. 15 and 16 illustrate the processing stage of the structure after removal of the remaining first sacrificial fill layer 140 and the etching of the isolation spacer 130. The remaining portions of the first sacrificial fill layer 140 are removed to expose portions of the isolation spacer 130. The removal process of the first sacrificial fill layer 140 also removes the third liner 145. The isolation spacer 130 is etched to remove the isolation spacer 130 from the source/drain regions and to expose a top surface of the upper layer of the lower stack LS.

FIGS. 17 and 18 illustrate the processing stage of the structure after etching the alternating layer of the lower stack LS to form a plurality of columns. The alternating layers of the lower stack LS are etched to form the lower source/drain region. A portion of the lower source/drain region is located beneath the upper source/drain region. The etching process to form the lower source/drain region causes the widening of the upper source/drain region. The widening of the upper source/drain region causes a step to be formed in the isolation spacer 130 as emphasized by dashed box 147.

FIGS. 19 and 20 illustrate the processing stage of the structure after etching/recessing of the sacrificial layers 118 of the upper stack US and the sacrificial layers 118 of the lower stack LS. The sacrificial layers 118 of the upper stack US and the lower stack LS are etched/recessed to expose the end of the channel layers 116 of the upper stack US and the lower stack LS.

FIGS. 21 and 22 illustrate the processing stage of the structure after formation of a lower inner spacer 155 and an upper inner spacer 160. A spacer material is deposited to form the lower inner spacer 155 and the upper inner spacer 160. Lower inner spacer 155 is located in the space created by the recessing of the sacrificial layer 118 of the lower stack LS. Upper inner spacer 160 is located in the space created by the recessing of the sacrificial layer 118 of the upper stack US.

FIGS. 23 and 24 illustrate the processing stage of the structure after formation of a second sacrificial fill layer 165. A second sacrificial fill layer 165 is deposited to fill the source/drain regions. The second sacrificial fill layer 165 is etched back/pulled down so that the second sacrificial fill layer 165 fills the lower source/drain region but is not present in the upper source/drain region. The second sacrificial fill layer 165 can be comprised of, for example, SOG.

FIGS. 25 and 26 illustrate the processing stage of the structure after formation of a fourth liner 170 and a fifth liner 175. A fourth liner 170 is formed on the exposed surfaces such that the fourth liner 170 is formed along the gate spacer 135, on top of the hardmask 127, and on top of the second sacrificial fill layer 165. The fourth liner 170 is also in contact with the isolation spacer 130. The fourth liner 170 can be comprised of, for example, an oxide layer, such as $SiO_x$. The fifth liner 175 is formed on top of the fourth liner 170. The fifth liner 175 can be comprised of, for example SiN.

FIGS. 27 and 28 illustrate the processing stage of the structure after etching of a portion of the fourth liner 170 and the fifth liner 175, and the removal of the second sacrificial fill layer 165. Portions of the fourth liner 170 and the fifth liner 175 are removed to expose the second sacrificial fill layer 165. The fourth liner 170 and the fifth liner 175 are still located adjacent to gate spacer 135 and is in contact with portions of the isolation spacer 130. The fourth liner 170 and the fifth liner 175 fill the step region in the isolation spacer 130, as emphasized by dashed box 147. The second sacrificial fill layer 165 is removed to expose the lower source/drain region.

FIGS. 29 and 30 illustrate the processing stage of the structure after formation of the lower source/drain 180. A lower source/drain 180 is grown in the lower source/drain region. The lower source/drain 180 can extend up into the space located between sections of the isolation spacer 130. The lower source/drains 180 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (TI) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

FIGS. 31 and 32 illustrate the processing stage of the structure after formation of a sixth liner 175A. The sixth liner 175A is formed on top of the lower source/drain 180. The sixth liner 175A can be comprised of the same material as the fifth liner 175 or it can be comprised of a different material. The sixth liner 175A can be in contact with the fourth liner 170 and the fifth liner 175. The sixth liner 175A creates a horizontal barrier on top of the lower source/drain 180.

FIGS. 33 and 34 illustrate the processing stage of the structure after formation of a third sacrificial fill layer 185. A third sacrificial fill layer 185 is deposited in the upper source/drain region, such that the third sacrificial fill layer 185 is formed on top of the sixth liner 175A. The third sacrificial fill layer 185 is recessed back to remove most of the material. A portion of the third sacrificial fill layer 185 remains in the upper source/drain region and on top of the sixth liner 175A as illustrated in FIGS. 33 and 34. The third sacrificial fill layer 185 can be comprised of, for example, oxide or a similar material.

FIGS. 35 and 36 illustrate the processing stage of the structure after removal of most of the fourth liner 170 and the fifth liner 175. Most of the fourth liner 170 and the fifth liner 175 are removed to expose the sidewalls of the gate spacer 135. The remaining portion of the fourth liner 170 and a portion of the fifth liner 175 is located adjacent to the remaining portion of the third sacrificial fill layer 185. The combined surfaces/profiles of the remaining fourth liner 170 or the remaining portions of the fifth liner 175 and the sixth liner 175A forms a combined U-shaped profile which is located between two adjacent upper stacks US as emphasized by dashed box 186 (also referred to as U-shaped profile 186, or first layer 186). Furthermore, the remaining vertical segments of the fifth liner 175 and the sixth liner 175A have a U-shaped profile between two adjacent upper stacks US as emphasized by dashed box 186.

FIGS. 37 and 38 illustrate the processing stage of the structure after recessing of the third sacrificial fill layer 185. The third sacrificial fill layer 185 is recessed to lower the height of the third sacrificial fill layer 185. A portion of the third sacrificial fill layer 185 remains as illustrated in FIGS. 37 to 42. FIGS. 43 and 44 illustrate the situation when the third sacrificial layer 185 is completed removed. The recessing/removal of the third sacrificial layer 185 exposes a portion of the remaining vertical segments of the fourth liner 170 and the fifth liner 175 while creating an empty space between the vertical segments as emphasized by dashed box 187.

FIGS. 39 and 40 illustrate the processing stage of the structure after formation of the upper source/drain 190 and the formation of a seventh liner 195. The upper source/drain 190 is formed in the upper source/drain region between the upper stacks US. The upper source/drains 190 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

A seventh liner 195 is formed on top of the upper source/drain 190. The seventh liner 195 is further formed on top of the remaining third sacrificial fill layer 185. The seventh liner 195 can be comprised of, for example, SiN. There is an airgap 200 located above the seventh liner 195 located on the third sacrificial fill layer 185 and located beneath the upper source/drain 190. Therefore, airgap 200 is located between the bottom surface of the upper source/drain 190 and the seventh liner 195 located on top of the third sacrificial fill layer 185. Airgap 200 is located between the upper source/drain 190 and the lower source/drain 180. As illustrated in FIG. 40, there is no airgap 200 present because the upper source/drain 190 was not form over the extended portion of the lower source/drain 180.

FIGS. 41 and 42 illustrate the processing stage of the structure after formation of a gate 210, a frontside interlayer dielectric layer 215, frontside upper source/drain contacts 220, frontside lower source/drain contacts 225, and a power distribution network 230. A frontside interlayer dielectric layer 215 is formed on top of the seventh liner 195 above the upper source/drains 190. The hardmask 127, the dummy gate 125, and the sacrificial layers 118 are removed to create space for the formation of the gate 210. Gate 210 is formed in the space created by the removal of these layers. Gate 210 can be separated between the upper and lower stacks or gate 210 can be shared between the upper and lower stacks. Gate 210 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. Additional frontside interlayer dielectric layer 215 material is added to extend the frontside interlayer dielectric layer 215 to cover the top surfaces of gate 210. A plurality of trenches (not shown) are created in the frontside interlayer dielectric layer 215 for the formation of the source/drain contacts 220, 225 and gate contacts (not shown). These trenches are filled with a conductive metal to form the upper source/drain contacts 220, the lower source/drain contacts 225, and gate contacts (not shown). The lower source/drain contacts 225 extends down through the seventh liner 195, the third sacrificial fill layer 185, and the sixth liner 175A to contact the lower source/drains 180, as illustrated in FIG. 42. An interconnect, a power distribution network, or different layer 230 is formed on top of the frontside contacts 220, 225, the gate contacts (not shown) and on top of the frontside interlayer dielectric layer 215.

FIGS. 43 and 44 illustrate the processing stage of the structure after formation of a gate 210, a frontside interlayer dielectric layer 215, frontside upper source/drain contacts 220, frontside lower source/drain contacts 225, and a power distribution network 230. FIGS. 43 and 44 are similar to FIGS. 41 and 42 and have similar components. The reference numbers refer to similar components in the Figures. The difference between FIG. 43 and FIG. 41 is that the third sacrificial fill layer 185 is not present. The third sacrificial fill layer 185 was completely removed during the process described in FIGS. 37 and 38. The complete removal of the third sacrificial fill layer 185 exposed the sixth liner 175A. The seventh liner 195 is formed on top of the sixth liner 175A. The seventh liner 195 and the sixth liner 175A can be comprised of the same material, for example, SiN, or they can be comprised of different materials. When sixth liner 175A and the seventh liner 195 are comprised of the same material (e.g., SiN) then the layers becomes indistinguishable from each other. The removal of the third sacrificial fill layer 185 allows for the creation of a larger airgap 235. When comparing the height of airgap 235 created by the complete removal of the third sacrificial fill layer 185 to the height of airgap 200 formed by the partial removal of the third sacrificial fill layer 185, it can be seen that the height of airgap 235 is larger than the height of airgrap 200.

A microelectronic structure that includes a stack nanosheet transistor comprising a lower nanosheet transistor LS and an upper nanosheet transistor US. The lower nanosheet transistor LS includes a lower source/drain 180 and the upper nanosheet transistor US includes an upper source/drain 190. An airgap 200 or 235 located between the upper source/drain 190 and the lower source/drain 189. The airgap 200 or 235 is vertically aligned with the upper source/drain 190 and the lower source/drain 180. A first layer 186 (includes sixth liner 175A, fourth liner 170 and/or fifth liner 175) located between the airgap 200 or 235 and the lower source/drain 180.

The first layer includes a horizontal section (e.g., sixth liner 175A) and at least two vertical sections (e.g., fourth liner 170 or fifth liner 175). The first layer has a U-shaped profile 186 as view from a cross section that is perpendicular to a gate direction. The first layer (175A, 175) is comprised of SiN.

The lower nanosheet transistor LS has a width larger than the width of the upper nanosheet transistor US as measured in parallel to the gate direction (as illustrated in the extension of the lower nanosheet transistor as seen in FIG. 42 or 44). A lower source/drain contact 225 that extends through the first layer 175A to make contact with the lower source/drain 180.

A microelectronic structure that includes a stack nanosheet transistor comprising a lower nanosheet transistor LS and an upper nanosheet transistor US. The lower nanosheet transistor LS includes a lower source/drain 180 and the upper nanosheet transistor US includes an upper source/drain 190. An airgap 200 or 235 located between the upper source/drain 190 and the lower source/drain 189. The airgap 200 or 235 is vertically aligned with the upper source/drain 190 and the lower source/drain 180. A first layer 186 (includes sixth liner 175A, fourth liner 170 and/or fifth liner 175) located between the airgap 200 or 235 and the lower source/drain 180. A second layer 185 located directly on top of the first layer 175A and the second layer 185 is located between the airgap 200 and the lower source/drain 180.

The first layer includes a horizontal section (e.g., sixth liner 175A) and at least two vertical sections (e.g., fourth liner 170 or fifth liner 175). The first layer has a U-shaped profile 186 as view from a cross section that is perpendicular to a gate direction. The second layer 185 is located on top of the horizontal section 175A of the first layer. The at least two vertical sections (170 or 175) of the first layer extend higher than the height of second layer 185 (see, for example, FIG. 41).

A first liner 195 that is located on top of the upper source/drain 190 and the first liner 195 is located on top of the second layer 185. The at least two vertical sections (170 or 175) of the first layer extend higher than the combined height of the second layer 185 and the first liner 195, see for example dashed box 186 in FIG. 41. The first liner 195 makes the bottom boundary of the airgap 200. The at least two vertical sections 175 or 170 of the first layer make the side boundaries of the airgap 200. The bottom surface of the upper source/drain 190 makes the top boundary of the airgap 200. The second layer 185 is comprised of an oxide.

A method that includes the steps of forming a stack nanosheet transistor comprising a lower nanosheet transistor LS and an upper nanosheet transistor US. The lower nanosheet transistor LS includes a lower source/drain 180 and the upper nanosheet transistor US includes an upper source/drain 190. Forming an airgap 200 or 235 located between the upper source/drain 190 and the lower source/drain 189. The airgap 200 or 235 is vertically aligned with the upper source/drain 190 and the lower source/drain 180. Forming a first layer 186 (includes sixth liner 175A, fourth liner 170 and/or fifth liner 175) located between the airgap 200 or 235 and the lower source/drain 180.

Forming a second layer 185 located directly on top of the first layer 175A and the second layer 185 is located between the airgap 200 and the lower source/drain 180. Forming a first liner 195 on top of the upper source/drain 190 and forming the first liner 195 on top of the second layer 185.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:

a stack nanosheet transistor comprising a lower nanosheet transistor and an upper nanosheet transistor, wherein the lower nanosheet transistor includes a lower source/drain, wherein the upper nanosheet transistor includes an upper source/drain;

an airgap located between the upper source/drain and the lower source/drain, wherein the airgap is vertically aligned with the upper source/drain and the lower source/drain; and a first layer located between the airgap and the lower source/drain.

2. The microelectronic structure of claim 1, wherein the first layer includes a horizontal section and at least two vertical sections.

3. The microelectronic structure of claim 2, wherein the first layer has a U-shaped profile as view from a cross section that is perpendicular to a gate direction.

4. The microelectronic structure of claim 3, wherein the first layer is comprised of SiN.

5. The microelectronic structure of claim 1, wherein the lower nanosheet transistor has a width larger than a width of the upper nanosheet transistor as measured in parallel to the gate direction.

6. The microelectronic structure of claim 5, further comprising:

a lower source/drain contact that extends through the first layer to make contact with the lower source/drain.

7. A microelectronic structure comprising:

a stack nanosheet transistor comprising a lower nanosheet transistor and an upper nanosheet transistor, wherein the lower nanosheet transistor includes a lower source/drain, wherein the upper nanosheet transistor includes an upper source/drain;

an airgap located between the upper source/drain and the lower source/drain, wherein the airgap is vertically aligned with the upper source/drain and the lower source/drain;

a first layer located between the airgap and the lower source/drain; and a second layer located directly on top of the first layer, wherein the second layer is located between the airgap and the lower source/drain.

8. The microelectronic structure of claim 7, wherein the first layer includes a horizontal section and at least two vertical sections.

9. The microelectronic structure of claim 8, wherein the first layer has a U-shaped profile as view from a cross section that is perpendicular to a gate direction.

10. The microelectronic structure of claim 9, wherein the second layer is located on top of the horizontal section of the first layer.

11. The microelectronic structure of claim 10, wherein the at least two vertical sections of the first layer extend higher than a height of second layer.

12. The microelectronic structure of claim 11, further comprising:

a first liner that is located on top of the upper source/drain and the first liner is located on top of the second layer.

13. The microelectronic structure of claim 12, wherein the at least two vertical sections of the first layer extend higher than the combined height of the second layer and the first liner.

14. The microelectronic structure of claim 13, wherein the first liner makes a bottom boundary of the airgap.

15. The microelectronic structure of claim 14, wherein the at least two vertical sections of the first layer make side boundaries of the airgap.

16. The microelectronic structure of claim 15, wherein a bottom surface of the upper source/drain makes a top boundary of the airgap.

17. The microelectronic structure of claim 16, wherein the second layer is comprised of an oxide.

18. A method comprising:

forming a stack nanosheet transistor comprising a lower nanosheet transistor and an upper nanosheet transistor, wherein the lower nanosheet transistor includes a lower source/drain, wherein the upper nanosheet transistor includes an upper source/drain;

forming an airgap located between the upper source/drain and the lower source/drain, wherein the airgap is vertically aligned with the upper source/drain and the lower source/drain; and forming a first layer located between the airgap and the lower source/drain.

19. The method of claim 18, further comprising:

forming a second layer located directly on top of the first layer, wherein the second layer is located between the airgap and the lower source/drain.

20. The method of claim 19, further comprising:

forming a first liner on top of the upper source/drain and forming the first liner on top of the second layer.

* * * * *